United States Patent
Najafi et al.

(10) Patent No.: US 12,339,163 B1
(45) Date of Patent: *Jun. 24, 2025

(54) SCALABLE PHOTON NUMBER RESOLVING PHOTON DETECTOR

(71) Applicant: PsiQuantum Corp., Palo Alto, CA (US)

(72) Inventors: Faraz Najafi, San Francisco, CA (US); Eric Dudley, Sacramento, CA (US)

(73) Assignee: PSIQUANTUM CORP., Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/639,722

(22) Filed: Apr. 18, 2024

Related U.S. Application Data

(63) Continuation of application No. 17/098,235, filed on Nov. 13, 2020, now Pat. No. 11,994,426.

(Continued)

(51) Int. Cl.
  *G01J 1/44* (2006.01)
  *G01J 1/42* (2006.01)
  (Continued)

(52) U.S. Cl.
  CPC .............. *G01J 1/44* (2013.01); *G01J 1/4228* (2013.01); *G06N 10/00* (2019.01); *H10N 60/30* (2023.02);
  (Continued)

(58) Field of Classification Search
  CPC ...... G01J 1/44; G01J 1/4228; G01J 2001/442; G01J 2001/4473; G06N 10/00; H10N 60/30; H10N 60/84; H10N 69/00
  See application file for complete search history.

(56) References Cited

U.S. PATENT DOCUMENTS

| 3,059,196 A | 10/1962 | Lentz |
| 3,119,076 A | 1/1964 | Schlig et al. |

(Continued)

FOREIGN PATENT DOCUMENTS

| CN | 106289515 A | 1/2017 |
| CN | 106549099 A | 3/2017 |

(Continued)

OTHER PUBLICATIONS

S. Pagano et al., "Nano-Strip Three-Terminal Superconducting Device for Cryogenic Detector Readout," in IEEE Transactions on Applied Superconductivity, vol. 21, No. 3, pp. 717-720, Jun. 2011 (Year: 2011).*

(Continued)

*Primary Examiner* — Georgia Y Epps
*Assistant Examiner* — Monica T Taba
(74) *Attorney, Agent, or Firm* — Morgan, Lewis & Bockius LLP

(57) ABSTRACT

An example photon counting device includes one or more unit cells. Each unit cell includes one or more superconducting components. Each unit cell also includes a current dynamics control element coupled in series with the one or more superconducting components. Each unit cell further includes a transistor having a superconducting gate element that is coupled with the one or more superconducting components and a channel element that is electrically insulated from the superconducting gate element, where the channel element has a first resistance while the superconducting gate element is in a superconducting state and a second resistance while the superconducting gate element is in a non-superconducting state. The photon counting device further includes a bias current source coupled to the one or more unit cells and a waveguide optically coupled to the one or more unit cells.

20 Claims, 23 Drawing Sheets

Related U.S. Application Data

(60) Provisional application No. 62/935,051, filed on Nov. 13, 2019.

(51) Int. Cl.
*G06N 10/00* (2022.01)
*H10N 60/30* (2023.01)
*H10N 60/84* (2023.01)
*H10N 69/00* (2023.01)

(52) U.S. Cl.
CPC ............ *H10N 60/84* (2023.02); *H10N 69/00* (2023.02); *G01J 2001/442* (2013.01); *G01J 2001/4473* (2013.01)

(56) References Cited

U.S. PATENT DOCUMENTS

| | | | |
|---|---|---|---|
| 3,283,282 A | 11/1966 | Rosenberg | |
| 4,336,561 A | 6/1982 | Murphy | |
| 4,365,317 A | 12/1982 | Gheewala | |
| 4,509,146 A | 4/1985 | Wang et al. | |
| 4,647,954 A | 3/1987 | Graf et al. | |
| 4,904,869 A | 2/1990 | Schneider | |
| 4,989,051 A | 1/1991 | Whitehead et al. | |
| 5,006,705 A | 4/1991 | Saito et al. | |
| 5,026,682 A | 6/1991 | Clark et al. | |
| 5,030,614 A | 7/1991 | Hollander et al. | |
| 5,030,617 A | 7/1991 | Legge | |
| 5,041,880 A | 8/1991 | Nojima et al. | |
| 5,051,787 A | 9/1991 | Hasegawa | |
| 5,053,383 A | 10/1991 | Short et al. | |
| 5,127,928 A | 7/1992 | Farries et al. | |
| 5,173,620 A | 12/1992 | Fujimaki et al. | |
| 5,219,826 A | 6/1993 | Kapitulnik | |
| 5,247,475 A | 9/1993 | Hasunuma et al. | |
| 5,321,004 A | 6/1994 | Perez et al. | |
| 5,365,476 A | 11/1994 | Mukhanov | |
| 5,376,626 A | 12/1994 | Drehman et al. | |
| 5,455,519 A | 10/1995 | Ohori | |
| 5,481,119 A | 1/1996 | Higashino et al. | |
| 5,521,862 A | 5/1996 | Frazier | |
| 5,574,290 A | 11/1996 | You | |
| 5,719,105 A | 2/1998 | Odagawa et al. | |
| 5,825,240 A | 10/1998 | Geis et al. | |
| 5,831,278 A | 11/1998 | Berkowitz | |
| 5,892,644 A | 4/1999 | Evans | |
| 5,925,892 A | 7/1999 | Mizuno et al. | |
| 6,029,075 A | 2/2000 | Das et al. | |
| 6,078,517 A | 6/2000 | Herr | |
| 6,242,939 B1 | 6/2001 | Nagasawa | |
| 6,433,974 B2 | 8/2002 | Heismann | |
| 6,774,463 B1* | 8/2004 | Chaudhari | H01L 29/437 505/235 |
| 6,900,714 B1 | 5/2005 | Huang et al. | |
| 7,227,438 B2 | 6/2007 | Song et al. | |
| 7,513,765 B2 | 4/2009 | Liao | |
| 7,558,030 B2 | 7/2009 | Lee et al. | |
| 7,589,323 B2 | 9/2009 | Tanaka et al. | |
| 7,724,083 B2 | 5/2010 | Herring et al. | |
| 7,847,282 B2 | 12/2010 | Sandhu | |
| 7,852,106 B2 | 12/2010 | Herr et al. | |
| 8,330,145 B2 | 12/2012 | Wakana et al. | |
| 8,565,844 B2 | 10/2013 | Smith | |
| 8,577,430 B1 | 11/2013 | Smith | |
| 8,736,085 B2 | 5/2014 | Sines | |
| 9,240,539 B2 | 1/2016 | Nam et al. | |
| 9,293,240 B2 | 3/2016 | Kroulik | |
| 9,443,576 B1 | 9/2016 | Miller | |
| 9,500,519 B2 | 11/2016 | Tang et al. | |
| 9,509,315 B2 | 11/2016 | McCaughan et al. | |
| 9,853,645 B1 | 12/2017 | Mukhanov et al. | |
| 9,876,505 B1 | 1/2018 | Dai et al. | |
| 9,954,158 B2 | 4/2018 | You et al. | |
| 9,998,122 B2 | 6/2018 | Hamilton et al. | |
| 10,103,736 B1 | 10/2018 | Powell et al. | |
| 10,133,986 B1 | 11/2018 | Newton et al. | |
| 10,171,086 B2 | 1/2019 | McCaughan et al. | |
| 10,177,298 B1 | 1/2019 | Taylor et al. | |
| 10,186,858 B2 | 1/2019 | Klaus et al. | |
| 10,197,440 B2 | 2/2019 | Najafi | |
| 10,262,776 B2 | 4/2019 | Choi et al. | |
| 10,361,703 B2 | 7/2019 | Najafi | |
| 10,386,229 B2 | 8/2019 | Najafi et al. | |
| 10,396,733 B2 | 8/2019 | Najafi et al. | |
| 10,454,014 B2 | 10/2019 | Najafi et al. | |
| 10,454,016 B2 | 10/2019 | Fong et al. | |
| 10,566,516 B2 | 2/2020 | Najafi | |
| 10,573,800 B1 | 2/2020 | Najafi | |
| 10,586,910 B2 | 3/2020 | Najafi | |
| 10,620,044 B2 | 4/2020 | Thompson et al. | |
| 10,651,325 B2 | 5/2020 | Najafi et al. | |
| 10,879,905 B2 | 12/2020 | Najafi et al. | |
| 10,897,235 B2 | 1/2021 | Najafi et al. | |
| 10,911,031 B2 | 2/2021 | Wise et al. | |
| 10,944,403 B2 | 3/2021 | Najafi | |
| 10,984,857 B2 | 4/2021 | Najafi | |
| 11,009,387 B2 | 5/2021 | Chung et al. | |
| 11,313,719 B2 | 4/2022 | Najafi et al. | |
| 11,473,974 B2 | 10/2022 | Thompson et al. | |
| 11,629,995 B2 | 4/2023 | Najafi et al. | |
| 2002/0110328 A1 | 8/2002 | Bischel et al. | |
| 2002/0149453 A1 | 10/2002 | Snitchler et al. | |
| 2003/0087503 A1 | 5/2003 | Sakaguchi et al. | |
| 2005/0153843 A1 | 7/2005 | Kubota | |
| 2005/0197254 A1 | 9/2005 | Stasiak et al. | |
| 2006/0073979 A1 | 4/2006 | Thieme et al. | |
| 2006/0183327 A1 | 8/2006 | Moon | |
| 2006/0270224 A1 | 11/2006 | Song et al. | |
| 2008/0026234 A1 | 1/2008 | Sambasivan et al. | |
| 2008/0197285 A1 | 8/2008 | Frey et al. | |
| 2008/0272302 A1 | 11/2008 | Frey et al. | |
| 2009/0014433 A1 | 1/2009 | O'Neil et al. | |
| 2010/0026447 A1 | 2/2010 | Keefe et al. | |
| 2010/0171098 A1 | 7/2010 | Suzuki | |
| 2011/0108803 A1 | 5/2011 | Deligianni et al. | |
| 2011/0116742 A1 | 5/2011 | Chang et al. | |
| 2011/0254053 A1 | 10/2011 | Goupil et al. | |
| 2013/0012392 A1 | 1/2013 | Tanaka et al. | |
| 2013/0090244 A1 | 4/2013 | Shinzato et al. | |
| 2013/0124112 A1 | 5/2013 | Heath et al. | |
| 2013/0143744 A1 | 6/2013 | Marsili et al. | |
| 2013/0150247 A1 | 6/2013 | Reeves et al. | |
| 2013/0341594 A1 | 12/2013 | Mohseni et al. | |
| 2014/0103196 A1 | 4/2014 | Soga et al. | |
| 2014/0113828 A1 | 4/2014 | Gilbert et al. | |
| 2014/0299751 A1* | 10/2014 | Tang | B82Y 20/00 385/14 |
| 2015/0018218 A1 | 1/2015 | Lakrimi et al. | |
| 2015/0179916 A1 | 6/2015 | Pramanik et al. | |
| 2015/0348681 A1 | 12/2015 | Huh | |
| 2016/0028402 A1 | 1/2016 | McCaughan et al. | |
| 2016/0028403 A1* | 1/2016 | McCaughan | H10N 60/205 326/104 |
| 2016/0356708 A1 | 12/2016 | Bennett et al. | |
| 2017/0186933 A1 | 6/2017 | Sunter et al. | |
| 2018/0033944 A1 | 2/2018 | Ladizinsky et al. | |
| 2018/0145664 A1 | 5/2018 | Herr et al. | |
| 2018/0335343 A1 | 11/2018 | Najafi et al. | |
| 2018/0364097 A1 | 12/2018 | Najafi | |
| 2018/0374979 A1 | 12/2018 | Nozawa | |
| 2019/0027672 A1 | 1/2019 | Megrant | |
| 2019/0035904 A1 | 1/2019 | Najafi | |
| 2019/0035999 A1 | 1/2019 | Najafi | |
| 2019/0044051 A1 | 2/2019 | Caudillo et al. | |
| 2019/0109595 A1 | 4/2019 | Najafi | |
| 2019/0148848 A1 | 5/2019 | Najafi et al. | |
| 2019/0227230 A1 | 7/2019 | Novack et al. | |
| 2019/0288132 A1 | 9/2019 | Wang et al. | |
| 2019/0378874 A1 | 12/2019 | Rosenblatt et al. | |
| 2020/0027502 A1 | 1/2020 | Berggren et al. | |
| 2020/0066962 A1 | 2/2020 | Najafi | |
| 2020/0080890 A1 | 3/2020 | Najafi et al. | |
| 2020/0111944 A1 | 4/2020 | Moodera et al. | |

(56) References Cited

U.S. PATENT DOCUMENTS

| | | | |
|---|---|---|---|
| 2020/0176662 | A1 | 6/2020 | Dayton et al. |
| 2020/0194656 | A1 | 6/2020 | Najafi |
| 2020/0256722 | A1 | 8/2020 | Najafi et al. |
| 2021/0119102 | A1 | 4/2021 | Zhu et al. |
| 2021/0183767 | A1 | 6/2021 | Najafi et al. |
| 2021/0239518 | A1 | 8/2021 | Chung et al. |
| 2021/0384878 | A1 | 12/2021 | Najafi et al. |
| 2023/0175887 | A1 | 6/2023 | Najafi et al. |
| 2023/0213380 | A1 | 7/2023 | Thompson et al. |
| 2024/0339978 | A1 | 10/2024 | Najafi et al. |
| 2024/0369408 | A1 | 11/2024 | Thompson et al. |
| 2024/0402004 | A1 | 12/2024 | Chung et al. |
| 2024/0410749 | A1 | 12/2024 | Najafi et al. |

FOREIGN PATENT DOCUMENTS

| | | |
|---|---|---|
| DE | 2440576 B1 | 1/1976 |
| DE | 19714191 C1 | 7/1998 |
| EP | 0299879 A2 | 1/1989 |
| EP | 1965184 A1 | 9/2008 |
| GB | 2530500 A | 3/2016 |
| JP | S63299282 A | 12/1988 |
| JP | H0555647 A | 3/1993 |
| WO | WO90/14715 A1 | 11/1990 |
| WO | WO94/09566 A1 | 4/1994 |
| WO | WO2012052628 A2 | 4/2012 |

OTHER PUBLICATIONS

Akhlaghi et al., "Gated Mode145:149 Superconducting Nanowire Single Photon Detectors," Optics Express, vol. 20, No. 2, Jan. 16, 2012, 9 pgs.

Atikian, Haig A. et al., "Superconducting Nanowire Single Photon Detector on Diamond," arXiv:1401.4490v1, physics.optics, Jan. 17, 2014, 5 pgs.

Cheng, Risheng et al., "Photon-Number-Resolving Detector Based on Superconducting Serial Nanowires," IEEE Transactions on Applied Superconductivity, vol. 23, No. 1, Feb. 2013, 9 pgs.

Clem, John R. et al., "Geometry-dependent critical currents in superconducting nanocircuits," arXiv:1109.4881v1 [cond-mat.supr-con] Sep. 22, 2011, 29 pgs.

Dai, Daoxin et al., "Mode conversion in tapered submicron silicon ridge optical waveguides," Optics Express, vol. 20, No. 12, Jun. 4, 2012, 15 pgs.

Henrich, D. et al., "Geometry-inducted reduction of the critical current in superconducting nanowires," arXiv:1204.0616v2 [cond-mat-supr-con] Aug. 22, 2012, 6 pgs.

Hortensius, H.L. et al., "Critical-Current Reduction in Thin Superconducting Wires Due to Current Crowding," arXiv:1203.4253v3, [cond-mat-supr-con], May 6, 2012, 5 pgs.

Korzh, B.A. et al., "Demonstrating sub-3 ps temporal resolution in a superconducting nanowire single-photon detector," Apr. 18, 2018, 26 pgs.

Lee, S.-B. et al., "Fabrication of a self-aligned superconducting nanotransistor based NOR logic gate," Microelectronic Engineering 57-58, 2001, 7 pgs., downloaded from https://www.sciencedirect.com/science/article/abs/pii/S0167931701004269).

Marsili, F., "Single-photon detectors based on ultra-narrow superconducting nanowires," Massachusetts Institute of Technology, Department of Electrical Engineering and Computer Science, Dec. 19, 2010, 31 pgs.

Mattioli, Francesco et al., "Photon-number-resolving superconducting nanowire detectors," Superconductor Science and Technology, Aug. 24, 2015, 16 pgs.

McGaughan, "Superconducting thin film nanoelectronics," Sep. 2015, Massachusetts Institute of Technology, submitted to the Department of Electrical Engineering and Computer Science in partial fulfillment of the requirements for the degree of Doctor of Philosophy in Electrical Engineering, 22 pgs.

Murphy et al., "Nanoscale superconducting memory based on the kinetic inductance of asymmetric nanowire loops," Department of Physics, University of Illinois at Urbana-Champaign, arXiv:1701.08715v2 [cond-mat.supr-con] Jun. 29, 2017, 19 pgs.

Natarajan et al., "Superconducting nanowire single-photon detectors: physics and applications", 2012, Superconduc. Sci. Technology vol. 25, 17 pgs.

Quaranta et al., Superconductive Three-Terminal Amplifier/Discriminator, IEEE Transactions on Applied Superconductivity, vol. 19, No. 3, Jun. 2, 2009, 4 pgs.

Schmidt, E. et al., AIN-Buffered Superconducting NbN Nanowire Single-Photon Detector on GaAs, IEEE Transactions on Applied Superconductivity, vol. 27, No. 4, Jun. 2017, 5 pgs.

Shiino, Tatsuya et al., "Improvement of Critical Temperature of Superconducting NbTiN and NbN Thin Films Using the AIN Buffer Layer," Superconductor Science and Technology, Mar. 2010, 11 pgs.

Zhao, Qing-Yuan et al., "A compact superconducting nanowire memory element operated by nanowire cryotrons," Massachusetts Institute of Technology, Department of Electrical Engineering and Computer Science, Nov. 22, 2017, 20 pgs.

McCaughan, A.N., et al., "Using Geometry to Sense Current," Nano Letters 16 (2016), 6 pgs.

Saraswat et al., "Highly oriented, free-standing, superconducting NbN films growth on chemical vapor deposited graphene," APL Materials 2, 056103 (2014); https://doi.org/10.1063/1.4875356 (Year: 2014), 7 pgs.

Stanfield, CMOS-Compatible, Piezo-Optomechanically Tunable Photonics for Visible Wavelengths and Cryogenic Temperatures, vol. 27, Issue 20, pp. 28588-28605, 2019, 18 pgs.

D. Sahin et al., "Waveguide photon-number-resolving detectors for quantum photonic integrated circuits", Appl. Phys. Lett., vol. 103, No. 11, p. 111116, Sep. 2013, 16 pgs.

Sergio Pagano et al., "Nano-Strip Three-Terminal Superconducting Device for Cryogenic Detector Readout", IEEE Transactions on Applied Superconductivity, vol. 21, No. 3, Jun. 2011, 4 pgs.

PsiQuantum Corp., International Search Report and Written Opinion, PCT/US2018/033042, Aug. 28, 2018, 13 pgs.

PsiQuantum Corp., International Search Report and Written Opinion, PCT/US2018/033041, Jul. 27, 2018, 16 pgs.

PsiQuantum Corp., International Search Report and Written Opinion, PCT/US2018/044091, Nov. 7, 2018, 12 pgs.

PsiQuantum Corp., Invitation to Pay Additional Fees/Partial Search Report, PCT/US2018/037892, Aug. 20, 2018, 12 pgs.

PsiQuantum Corp., Invitation to Pay Additional Fees/Partial Search Report, PCT/US2018/054414, Jan. 24, 2019, 21 pgs.

PsiQuantum Corp., International Search Report and Written Opinion, PCT/US2018/054414, Mar. 20, 2019, 21 pgs.

Najafi, Non-Final Office Action, U.S. Appl. No. 16/028,288, Dec. 12, 2018, 6 pgs.

Najafi, Notice of Allowance dated Apr. 5, 2019, U.S. Appl. No. 16/028,288, 10 pgs.

Najafi, Non-Final Office Action, U.S. Appl. No. 16/028,293, Sep. 21, 2018, 8 pgs.

Najafi, Final Office Action, U.S. Appl. No. 16/028,293, Mar. 1, 2019, 5 pgs.

Najafi, Notice of Allowance, U.S. Appl. No. 16/012,520, Sep. 21, 2018, 9 pgs.

Najafi, Non-Final Office Action, U.S. Appl. No. 16/136,124, Apr. 4, 2019, 9 pgs.

Najafi, Quayle Office Action, U.S. Appl. No. 16/151,180, Jan. 31, 2019, 5 pgs.

Najafi, Notice of Allowance, U.S. Appl. No. 16/151,180, Mar. 14, 2019, 5 pgs.

Najafi, Notice of Allowance, U.S. Appl. No. 16/151,190, Feb. 6, 2019, 11 pgs.

Najafi, Notice of Allowance, U.S. Appl. No. 16/151,190, Mar. 28, 2019, 5 pgs.

Najafi, Non-Office Action, U.S. Appl. No. 16/046,815, Feb. 4, 2019, 9 pgs.

Najafi, Notice of Allowance, U.S. Appl. No. 16/046,815, Oct. 7, 2019, 9 pgs.

(56) References Cited

OTHER PUBLICATIONS

Najafi, Non-Office Action, U.S. Appl. No. 16/046,807, Mar. 18, 2019, 10 pgs.
Najafi, Non-Office Action, U.S. Appl. No. 16/107,143, Mar. 19, 2019, 11 pgs.
Psiquantum Corp., International Search Report and Written Opinion, PCT/US2019/017687, Apr. 30, 2019, 13 pgs.
Psiquantum Corp., International Search Report and Written Opinion, PCT/US2019/017691, Apr. 23, 2019, 7 pgs.
Psiquantum Corp., International Preliminary Report on Patentability, PCT/US2019/017691, Aug. 18, 2020, 5 pgs.
PSIQUANTUM Corp., International Search Report and Written Opinion, PCT/US2019/030019, Jul. 17, 2019, 12 pgs.
PSIQUANTUM Corp., International Preliminary Report on Patentability, PCT/US2018/044091, Jan. 28, 2020, 6 pgs.
Najafi, Non-Final Office Action, U.S. Appl. No. 16/664,716, Apr. 1, 2020, 15 pgs.
Psiquantum, International Search Report and Written Opinion, PCT/US2019/051853, Jan. 27, 2020, 13 pgs.
Psiquantum, International Preliminary Report on Patentability, PCT/US2018/033041, Nov. 26, 2019, 8 pgs.
Psiquantum, International Preliminary Report on Patentability, PCT/US2018/054414, Apr. 8, 2020, 15 pgs.
Psiquantum, International Search Report and Written Opinion, PCT/US2018/037892, Oct. 17, 2018, 19 pgs.
Psiquantum, International Preliminary Report on Patentability, PCT/US2018/037892, Dec. 17, 2019, 12 pgs.
Najafi, Non-Final Office Action, U.S. Appl. No. 16/553,068, Apr. 1, 2020, 12 pgs.
Najafi, Non-Final Office Action, U.S. Appl. No. 16/544,718, Aug. 17, 2020, 7 pgs.
Najafi, Non-Final Office Action, U.S. Appl. No. 16/656,506, Aug. 13, 2020, 19 pgs.
Najafi, Notice of Allowance, U.S. Appl. No. 16/553,068, Sep. 18, 2020, 9 pgs.
Najafi, Notice of Allowance, U.S. Appl. No. 16/473,550, Sep. 24, 2020, 9 pgs.
Najafi, Notice of Allowance, U.S. Appl. No. 16/656,506, Nov. 3, 2020, 13 pgs.
Najafi, Final Office Action, U.S. Appl. No. 16/664,716, Oct. 16, 2020, 14 pgs.
Najafi, Notice of Allowance, U.S. Appl. No. 16/473,547, Dec. 9, 2020, 9 pgs.
Najafi, Notice of Allowance, U.S. Appl. No. 16/543,256, Dec. 9, 2020, 13 pgs.
Chung, Non-Final Office Action, U.S. Appl. No. 16/849,829, Aug. 21, 2020, 7 pgs.
Chung, Notice of Allowance, U.S. Appl. No. 16/849,829, Dec. 8, 2020, 5 pgs.
Psiquantum Corp., International Search Report and Written Opinion, PCT/US2020/028519, Jan. 12, 2021, 9 pgs.
Psiquantum Corp., Notice of Allowance, U.S. Appl. No. 16/849,829, Mar. 1, 2021, 8 pgs.
Psiquantum Corp., Notice of Allowance, U.S. Appl. No. 16/544,718, Feb. 5, 2021, 6 pgs.
Najafi, Notice of Allowance, U.S. Appl. No. 16/664,716, Jan. 28, 2021, 8 pgs.
Psiquantum, Notice of Allowance, U.S. Appl. No. 16/840,166, Mar. 23, 2021, 8 pgs.
Najafi, Notice of Allowance, U.S. Appl. No. 16/664,716, Apr. 21, 2021, 8 pgs.
Psiquantum, Corrected Notice of Allowance, U.S. Appl. No. 16/543,256, Mar. 24, 2021, 2 pgs.
Psiquantum, Notice of Allowance, U.S. Appl. No. 16/575,274, Apr. 22, 2021, 11 pgs.
Psiquantum, International Preliminary Report on Patentability, PCT/US2018/033042, Nov. 19, 2019, 7 pgs.
Psiquantum, International Preliminary Report on Patentability, PCT/US2019/051853, Mar. 23, 2021, 10 pgs.
Psiquantum, International Preliminary Report on Patentability, PCT/US2019/017687, Aug. 18, 2020, 6 pgs.
Psiquantum, International Preliminary Report on Patentability, PCT/US2019/030019, Nov. 3, 2020, 7 pgs.
Psiquantum, Notice of Allowance, U.S. Appl. No. 16/840,166, May 24, 2021, 5 pgs.
Najafi, Non-Final Office Action, U.S. Appl. No. 17/135,861, Sep. 23, 2021, 7 pgs.
Psiquantum, International Preliminary Report on Patentability, PCT/US2019/016885, Aug. 11, 2020, 7 pgs.
Psiquantum, International Search Report and Written Opinion, PCT/US2019/016885, Apr. 24, 2019, 9 pgs.
Thompson, Non-Final Office Action, U.S. Appl. No. 16/450,911, Aug. 2, 2019, 7 pgs.
Thompson, Notice of Allowance, U.S. Appl. No. 16/450,911, Dec. 11, 2019, 5 pgs.
Thompson, Non-Final Office Action, U.S. Appl. No. 16/985,137, Sep. 30, 2021, 7 pgs.
Thompson, Notice of Allowance, U.S. Appl. No. 16/985,137, May 26, 2022, 9 pgs.
Najafi, Notice of Allowance, U.S. Appl. No. 16/046,807, Oct. 29, 2019, 8 pgs.
Najafi, Notice of Allowance, U.S. Appl. No. 16/136,124, 27JUN2019, 8 pgs.
Psiquantum Corp., International Search Report and Written Opinion, PCT/US2018/060802, Apr. 8, 2019, 18 pgs.
Psiquantum, International Preliminary Report on Patentability, PCT/US2018/060802, May 19, 2020, 13 pgs.
Najafi, Notice of Allowance, U.S. Appl. No. 16/773,921, Sep. 22, 2021, 9 pgs.
Najafi, Notice of Allowance, U.S. Appl. No. 17/195,522, Nov. 12, 2021, 9 pgs.
Najafi, Notice of Allowance, U.S. Appl. No. 16/773,921, Nov. 15, 2021, 9 pgs.
Najafi, Notice of Allowance, U.S. Appl. No. 17/033,337, Dec. 9, 2021, 9 pgs.
Chung, Non-Final Office Action, U.S. Appl. No. 17/232,086, Dec. 16, 2021, 14 pgs.
Chung, Notice of Allowance, U.S. Appl. No. 17/232,086, May 11, 2022, 6 pgs.
Najafi, Notice of Allowance, U.S. Appl. No. 17/135,861, Jan. 28, 2022, 7 pgs.
Thompson, Non-Final Office Action, U.S. Appl. No. 16/985,137, Jan. 18, 2022, 8 pgs.
Najafi, Notice of Allowance, U.S. Appl. No. 16/623,503, Feb. 22, 2022, 11 pgs.
Najafi, Non-Final Office Action, U.S. Appl. No. 16/813,628, Mar. 7, 2022, 8 pgs.
Najafi, Final Office Action, U.S. Appl. No. 16/813,628, Aug. 29, 2022, 9 pgs.
Najafi, Non-Final Office Action, U.S. Appl. No. 16/813,628, Dec. 6, 2022, 8 pgs.
Najafi, Notice of Allowance, U.S. Appl. No. 16/813,628, Jun. 28, 2023, 8 pgs.
Najafi, Notice of Allowance, U.S. Appl. No. 18/103,413, Jul. 18, 2023, 9 pgs.
Najafi, Non-Final Office Action, U.S. Appl. No. 18/103,413, Nov. 7, 2023, 7 pgs.
Najafi, Non-Final Office Action, U.S. Appl. No. 17/150,889, Sep. 14, 2023, 9 pgs.
Najafi, Notice of Allowance, U.S. Appl. No. 17/160,283, Nov. 2, 2022, 9 pgs.
Najafi, Non-Final Office Action, U.S. Appl. No. 17/160,283, Jul. 15, 2022, 15 pgs.
Najafi, Non-Final Office Action, U.S. Appl. No. 17/160,283, Mar. 31, 2022, 18 pgs.
Najafi, Non-Final Office Action, U.S. Appl. No. 17/234,701, Feb. 1, 2022, 14 pgs.
Najafi, Notice of Allowance, U.S. Appl. No. 17/234,701, Jun. 6, 2022, 9 pgs.
Najafi, Non-Final Office Action, U.S. Appl. No. 16/840,182, Apr. 29, 2022, 13 pgs.

(56) References Cited

OTHER PUBLICATIONS

Najafi, Notice of Allowance, U.S. Appl. No. 16/840,182, Sep. 22, 2022, 10 pgs.
Najafi, Non-Final Office Action, U.S. Appl. No. 17/967,773, Oct. 20, 2023, 10 pgs.
Najafi, Non-Final Office Action, U.S. Appl. No. 17/098,235, Oct. 20, 2023, 16 pgs.
Najafi, Notice of Allowance, U.S. Appl. No. 18/103,413, Jan. 18, 2024, 8 pgs.
Najafi, Final Office Action, U.S. Appl. No. 17/967,773, Jan. 18, 2024, 12 pgs.
Najafi, Notice of Allowance, U.S. Appl. No. 17/098,235, Jan. 24, 2024, 5 pgs.
Najafi, Notice of Allowance, U.S. Appl. No. 17/150,889, Feb. 5, 2024, 8 pgs.
Najafi, Notice of Allowance, U.S. Appl. No. 17/967,773, Apr. 15, 2024, 7 pgs.
Najafi et al., Notice of Allowance, U.S. Appl. No. 17/461,892, Jun. 7, 2024, 8 pgs.

\* cited by examiner

1000 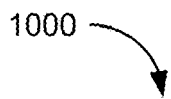

1030 In response to a photon being incident upon a photodetector of a respective unit cell of the plurality of unit cells:

1070 Transmit heat from the superconducting gate element to the channel element. The channel element of the transistor is a semiconductor channel element. The transistor includes a component coupled to each of the superconducting gate element and the semiconductor channel element. The component is electrically insulating and thermally conductive. A resistance of the semiconductor channel element of the transistor is decreased in response to an increase in temperature of the semiconductor channel element.

Figure 10C

SCALABLE PHOTON NUMBER RESOLVING PHOTON DETECTOR

PRIORITY AND RELATED APPLICATIONS

This application is a continuation of U.S. patent application Ser. No. 17/098,235, filed Nov. 13, 2020, which claims priority to U.S. Provisional Application No. 62/935,051, filed Nov. 13, 2019, entitled "Photon Number Resolving Photon Detector," each of which is hereby incorporated by reference in its entirety.

TECHNICAL FIELD

This relates generally to superconducting devices, including but not limited to, devices utilizing both superconducting and non-superconducting states.

BACKGROUND

Photon detectors are key components in many electronic devices. Ultra-sensitive photon detectors that are capable of detecting individual photons (e.g., single photons) can be used in a variety of applications, such as optical communications, medical diagnostics, space research, and optical quantum information applications such as optical quantum computing.

Superconductors are materials capable of operating in a superconducting state with zero electrical resistance under particular conditions. Superconductors are also capable of operating in a non-superconducting (conducting) state. Because of many useful properties of superconductors, photon detectors based on superconductors are expected to have superior performance over conventional photon detectors.

SUMMARY

The present disclosure describes a photon counting device that utilizes superconducting components that can undergo a phase transition from a superconducting state to a non-superconducting state. The photon counting device disclosed herein utilizes photodetectors that have a parallel-nanowire architecture and transistors that include superconducting transistor gates. The photon counting device also includes multi-segmented detector arrays (e.g., photodetectors) and a cascaded architecture to enable high efficiency, small size, resilience towards manufacturing defects, high count rates, low noise and photon number resolving photon detection.

In one aspect, some embodiments include a photon counting device that includes a plurality of unit cells, a bias current source coupled to the plurality of unit cells, and a waveguide coupled to the plurality of unit cells. Each unit cell of the plurality of unit cells includes one or more photodetectors and a transistor. Each photodetector of the one or more photodetectors includes one or more superconducting components. The transistor includes a superconducting gate element that is coupled in parallel with the one or more photodetectors, and a channel element that is electrically isolated from the superconducting gate element. The channel element has a first resistance while the superconducting gate element is in a superconducting state, and a second resistance while the superconducting gate element is in a non-superconducting state. For each respective unit cell in the plurality of unit cells: (i) a photodetector of the respective unit cell is optically coupled to the waveguide, (ii) a superconducting component of the one or more superconducting components of the one or more photodetectors of the respective unit cell is configured to transition from the superconducting state to the non-superconducting state in response to a photon being incident upon the superconducting component while the superconducting component receives at least a portion of bias current output from the bias current source, and (iii) the superconducting gate element of the transistor of the respective unit cell is configured to transition from the superconducting state to the non-superconducting state in response to the superconducting component transitioning to the non-superconducting state.

In another aspect, some embodiments include a method of applying a bias current to a plurality of unit cells. Each unit cell includes one or more photodetectors and a transistor. The transistor includes a superconducting gate element that is coupled in parallel with the one or more photodetectors, and a channel element that is isolated from the gate element. The method includes maintaining a temperature of one or more superconducting components in the one or more photodetectors and a temperature of the superconducting gate elements in the transistors below a threshold temperature (e.g., critical temperature, superconducting threshold temperature). In response to a photon being incident upon a photodetector of a respective unit cell of the plurality of unit cells: (i) one or more superconducting components in the one or more photodetectors transitions from a superconducting state to a non-superconducting state, (i) at least a portion of the bias current is redirected from the photodetectors of the respective unit cell to the superconducting gate element of the transistor, and (iii) the superconducting gate element of the transistor of the respective unit cell transitions from the superconducting state to the non-superconducting state In yet another aspect, some embodiments include a photon-number resolving detector that includes a plurality of photon detecting units that are coupled in series with one another, a readout line, and a second circuit coupled to the readout line. Each respective photon detecting unit of the plurality of photon detecting units include one or more superconducting photodetectors, and a gate of an impedance amplifier. The gate of the impedance amplifier is coupled in parallel with the one or more superconducting photodetectors of the respective photon detecting unit. The readout line includes output channels of the impedance amplifiers of each of the plurality of photon detecting units; and Thus, devices and circuits are provided with methods for operating superconducting devices, thereby increasing the robustness and user satisfaction with such circuits and devices.

BRIEF DESCRIPTION OF THE DRAWINGS

For a better understanding of the various described embodiments, reference should be made to the Detailed Description below, in conjunction with the following drawings in which like reference numerals refer to corresponding parts throughout the figures.

FIGS. 10A-10D illustrate a flow diagram of a method of operating the detection circuit shown in FIGS. 1, 6A-6D, 7A-7D, and 8 in accordance with some embodiments.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Many modifications and variations of this disclosure can be made without departing from its spirit and scope, as will be apparent to those skilled in the art. The specific embodiments described herein are offered by way of example only, and the disclosure is to be limited only by the terms of the appended claims, along with the full scope of equivalents to which such claims are entitled.

The present disclosure describes operating a photon counting device that utilizes transition of superconducting components from a superconducting state to a non-superconducting state (e.g., a non-superconducting conductive state or a high-resistance insulating state).

Figure 1:
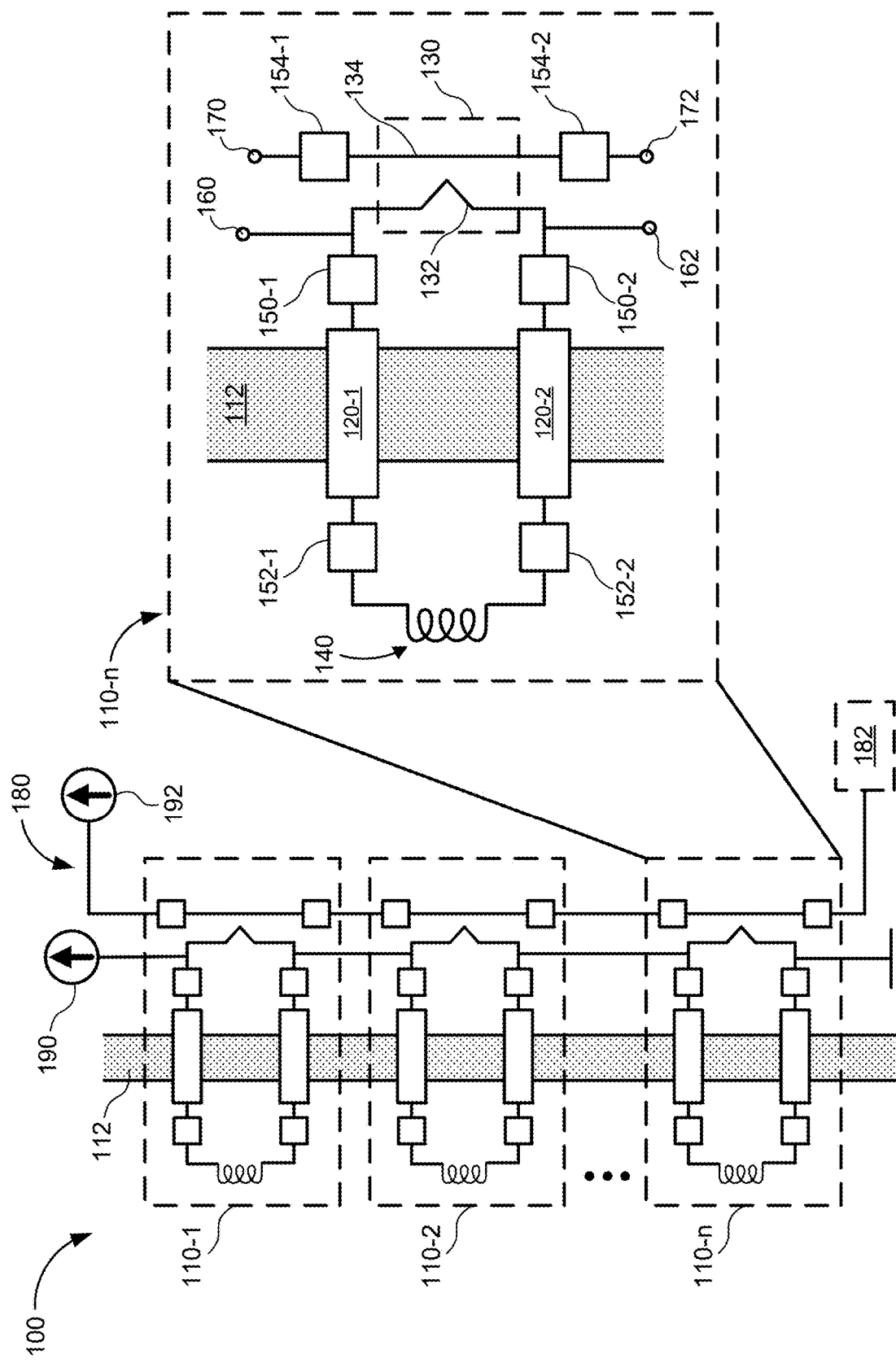
FIG. 1 is a circuit diagram illustrating a photon counting device in accordance with some embodiments.

FIG. 1 is a circuit diagram illustrating a photon counting device 100 that includes a plurality of unit cells 110 (e.g., 110-1, 110-2, . . . , 110-$n$) coupled in series to one another, a bias current source 190 (e.g., DC current source) configured to provide a bias current ($I_{bias}$) (e.g., a DC current) to the plurality of unit cells 110, and a waveguide 112 (e.g., optical waveguide, such as an optical fiber or a slab waveguide) coupled (e.g., optically coupled) to the plurality of unit cells 110.

In some embodiments, each unit cell 110-$n$ of the plurality of unit cells 110 includes one or more photodetectors 120, a transistor 130, a current dynamics control element 140, thermal buffer elements 150 and 152, a bias current input terminal 160, and a bias current output terminal 162.

Each photodetector (e.g., photodetector 120-1, 120-2) of the one or more photodetectors 120 includes one or more superconducting components. The photodetectors 120 are coupled (e.g., optically coupled) to the waveguide 112 and configured to receive (e.g., absorb) photons propagating in the waveguide 112. In some embodiments, the photodetector 120 includes two or more superconducting components (e.g., components composed of a superconducting material) that are coupled in parallel with each other. In some embodiments, the photodetectors 120 (e.g., the superconducting components of the photodetector 120) are biased (e.g., by the bias current, $I_{bias}$) below a threshold current (e.g., a threshold current density, a hotspot current) such that a superconducting component transitions from the non-superconducting state to the superconducting in response to absorption of light (e.g., absorption of a photon) by the superconducting component.

In some embodiments, the photodetector 120 is a Superconducting Nanowire Avalanche Photondetectors (SNAPs) that includes two or more (e.g., two, three, four, or five, or a number typically no more than 10) superconducting nanowires coupled in parallel to one another. In such cases, the superconducting components are superconducting nanowires. The Superconducting Nanowire Avalanche Photondetectors (SNAPs) provide amplification of a detection current that is produced in response to detection (e.g., absorption) of a photon, and can increase the signal-to-noise-ratio of a detection signal. Additional details regarding Superconducting Nanowire Avalanche Photondetectors (SNAPs) is provided with respect to FIG. 2.

The transistor 130 (e.g., a superconducting transistor, also referred to as a "Tron") includes a superconducting gate element 132 and a channel element 134. The superconducting gate element 132 of the transistor 130 is coupled in parallel with the one or more photodetectors 120. Stated another way, with the bias current input terminal 160 and a bias current output terminal 162 as terminals of the unit cell 110, the superconducting gate element 132 of the transistor 130 is coupled in parallel with the one or more photodetectors 120.

The channel elements 134 of transistors 130 of the plurality of unit cells 110 are coupled in series to one another to form a readout line 180 that is configured to transmit a signal (e.g., an electrical signal, a readout signal, a readout output). In some embodiments, the readout line 180 is coupled to an electrical source 192 (such as a voltage source or a current source, shown in FIG. 1 as a current source) that is configured to provide a detection current ($I_{det}$) to the readout line 180. In some embodiments, the readout line 180 is coupled to a circuit 182 (e.g., a readout circuit) that is configured to receive the signal from the readout line 180 (e.g., transmitted through the channel elements 134 of the transistors 130) and generate a signal corresponding to a count of photons received (e.g., how many photons are detected, a number photons that are detected) by the photon counting device 100. In some embodiments, the voltage of the detection current ($I_{det}$) received at the circuit 182 is proportional to (or, more generally, corresponds to) the number of detected photons.

In some embodiments, each unit cell 110-$n$ includes thermal buffers 154 (e.g., 154-1 and 154-2) such that channel elements 134 of transistors 130 of adjacent unit cells 110 are thermally isolated from one another. For example, as shown in FIG. 1, the channel element 134 of transistor 130 is disposed between two thermal buffers 154-1 and 154-2. Each unit cell also includes an input terminal 170 and an output terminal 172. The channel elements 134 of transistors 130 of the plurality of unit cells 110 are coupled to each other in series such that the output terminal 172 of the first unit cell 110-1 is coupled (e.g., electrically coupled, electrically connected) to an output terminal 172 of a subsequent (e.g., succeeding) unit cell 110-2. The input terminal 170 of the first unit cell 110-1 is coupled (e.g., electrically coupled, electrically connected) to the electrical source 192 for receiving a bias current ($I_{bias}$) output from the bias current source 190. The transistors 130 are used to spatially multiplex the unit cells 110, thereby enabling number-resolving multi-photon detection. Additional details regarding the transistor 130 is provided with respect to FIG. 3.

In some embodiments, each unit cell 110-$n$ includes thermal buffer elements 150 that are disposed between a photodetector 120 and the superconducting gate element 132 of transistor 130. For example, the unit cell 110-$n$ shown in FIG. 1 includes two photodetectors 120-1 and 120-2 and thermal buffer elements 150-1 and 150-2. Thermal buffer element 150-1 is disposed between photodetector 120-1 and the superconducting gate element 132 of transistor 130, and thermal buffer element 150-2 is disposed between photodetector 120-2 and the superconducting gate element 132 of transistor 130.

In some embodiments, each unit cell 110-$n$ includes thermal buffer elements 152 that are disposed between the photodetector 120 and current dynamics control element 140. For example, the unit cell 110-$n$ shown in FIG. 1 includes two photodetectors 120-1 and 120-2 and thermal buffer elements 152-1 and 152-2. Thermal buffer element 152-1 is disposed between photodetector 120-1 and the current dynamics control element 140, and thermal buffer element 152-2 is disposed between photodetector 120-2 and the current dynamics control element 140.

The current dynamics control element 140 is coupled in series with the one or more photodetectors 120 of the unit cell 110-$n$. The current dynamics control element 140 is associated with a predefined relaxation time (e.g., recovery time) of the unit cell 110-$n$. Examples of current dynamics control element 140 is provided with respect to FIGS. 4A-4D.

The bias current input terminal 160 and the bias current output terminal 162 of a unit cell 110-$n$ are coupled (e.g., electrically coupled, electrically connected) to the one or more photodetectors 120 and the superconducting gate element 132 of the transistor 130 of the unit cell 110-$n$ such that a bias current ($I_{bias}$) can be transmitted from the bias current input terminal 160, through the one or more photodetectors 120 and/or the superconducting gate element 132 of the transistor 130, to the bias current output terminal 162. The plurality of unit cells 110 is coupled in series with one another such that a bias current output terminal 162 of a first unit cell 110-1 is coupled (e.g., electrically coupled, electrically connected) to a bias current input terminal 160 of a subsequent (e.g., succeeding) unit cell 110-2. The bias current input terminal 160 of the first unit cell 110-1 is coupled (e.g., electrically coupled, electrically connected) to the bias current source 190 for receiving a bias current ($I_{bias}$) output from the bias current source 190.

Each of the unit cells 110 of the photon counting device 100 operate independently from one another (e.g., the unit cells are functionally isolated from one another) such that the state of a first unit cell 110-1 does not affect the state of another unit cell 110-$n$ and such that there is no cross-talk between the unit cells 110 that affects the ability of the unit cells to detect photons. For example, if a photodetector of the one or more photodetectors 120 of the first unit cell 110-1 detects a photon (e.g., a photon is incident upon a photodetector 120 of the first unit cell 110-1), photodetectors 120 of the other unit cells 110-$n$ continue to operate and are agnostic to (e.g., do not respond to, continue to function without knowledge of, continue to function without responding to) whether or not a photodetector 120 of the first unit cell 110-1 detects a photon.

Figure 2:
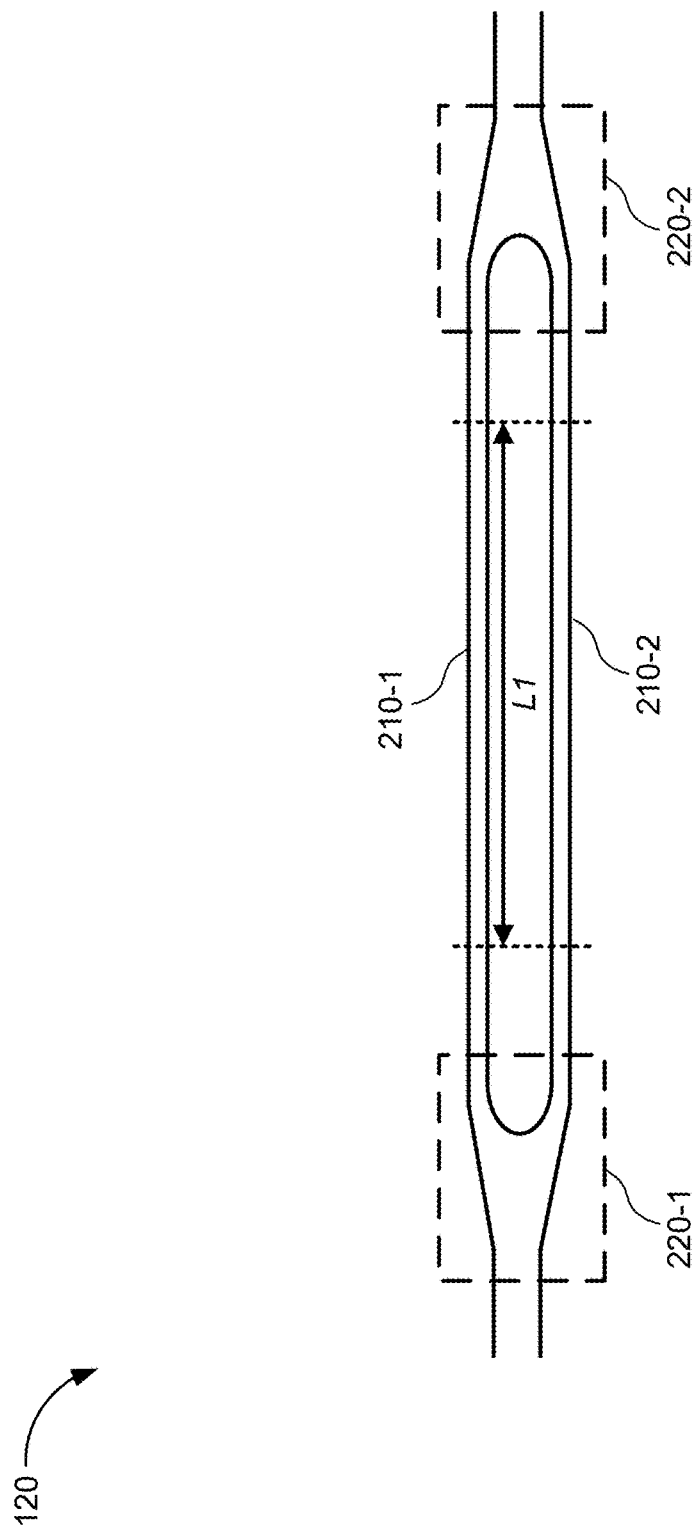
FIG. 2 illustrates a photodetector of the photon counting device shown in FIG. 1 in accordance with some embodiments.

FIG. 2 illustrates a photodetector 120 of the photon counting device 100 shown in FIG. 1 in accordance with some embodiments. In some embodiments, the photodetector 120 is a Superconducting Nanowire Avalanche Photondetector (SNAP) that includes two or more superconducting components (e.g., two, three, four, or five, or a number typically no more than 10 superconducting components 210) coupled in parallel to one another. In some embodiments, each superconducting component 210 is a superconducting nanowire. In this example, the SNAP includes a first superconducting component 210-1 and a second superconducting component 210-2 coupled in parallel to one another. Each superconducting component 210 of the photodetector 120 is coupled (e.g., optically coupled) to waveguide 112 and acts as an independent (e.g., isolated) photodetector that absorbs a portion (e.g., less than all, a subset, a fraction) of light propagating in the waveguide 112. In some embodiments, each superconducting component 210 of the SNAP has a predetermined length, l. For example, the length, l, of the superconducting component 210-1 and 210-2 may be approximately 2 μm, and typically is less than 5 μm or 10 μm. The short length (e.g., ~2 μm) of the superconducting component 210 increases yield and decreases dark counts due to light scattering.

The SNAP also includes junctions 220 (e.g., a compact junction) that are disposed between the superconducting nanowires 210 and the rest of the circuit (e.g., the rest of the photon counting device 100). For example, the superconducting components 210-1 and 210-2 are disposed between junctions 220-1 and 220-2.

Additional details regarding the structure and operation of the transistor 130 is provided in U.S. Patent Publication US2020/0256722A1, which is hereby incorporated by reference in its entirety.

Figure 3:
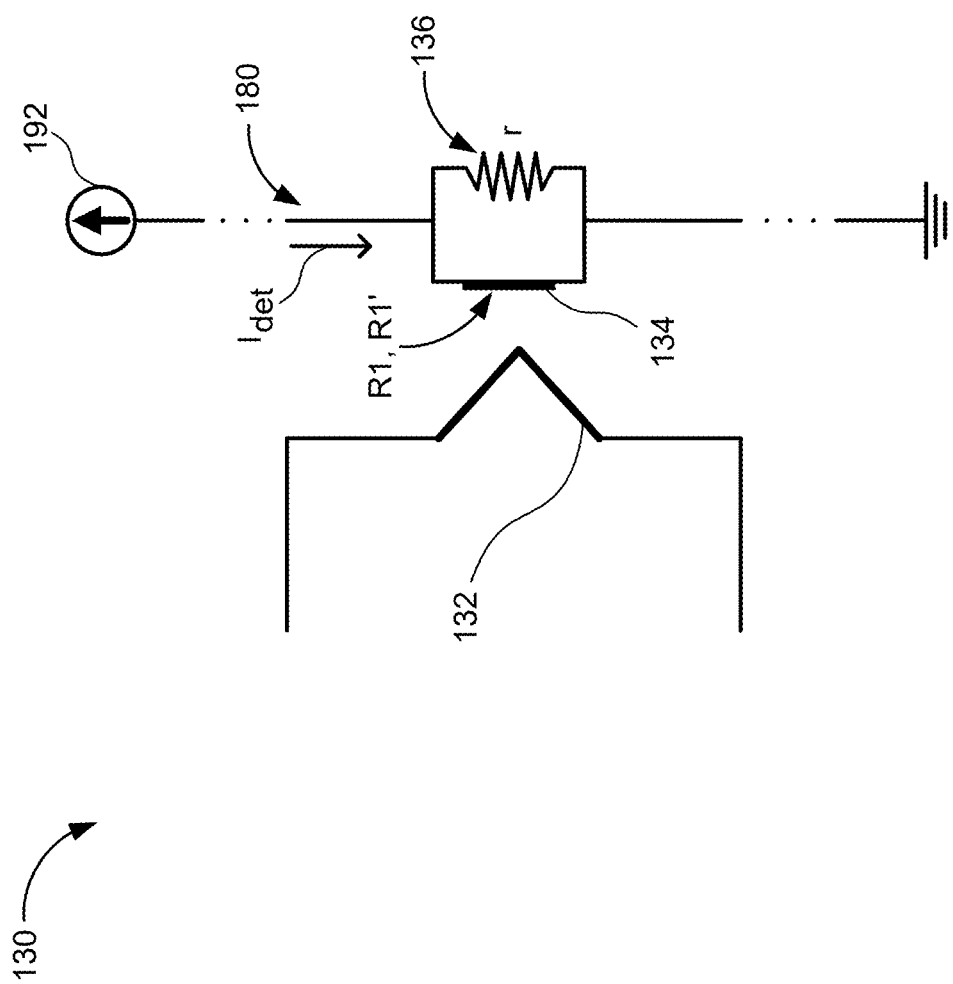
FIG. 3 is a circuit diagram illustrating a transistor of the photon counting device shown in FIG. 1 in accordance with some embodiments.

FIG. 3 is a circuit diagram illustrating a transistor 130 of a unit cell 110-$n$ of the photon counting device 100 shown in FIG. 1 in accordance with some embodiments. Transistor 130 includes a superconducting gate element 132 and a channel element 134 (e.g., source-drain channel element). The channel element 134 is thermally coupled to and electrically isolated from the superconducting gate element 132 such that heat can be transferred between the superconducting gate element 132 and the channel element 134, but electrical current is not transferred between the superconducting gate element 132 and the channel element 134. In some embodiments, the transistor 130 includes an electrically insulating and thermally conductive component that is configured to thermally couple and electrically isolate the superconducting gate element 132 and the channel element 134. The superconducting gate element 132 is electrically isolated (e.g., current isolated) from the channel element 134, which allows the photon counting device 100 to be able to be scaled to include many unit cells 110-$n$ (e.g., up to thousands of unit cells 110-$n$) without significant loss in performance. Additionally, by electrically isolating the superconducting gate element 132 from the channel element 134, the readout line 180 is electrically isolated from operation of the photodetector 120 and the superconducting gate element 132 off the transistor 130. Thus, there is no cross-talk between the photon detection circuitry (e.g., photodetectors 120) and the signal detection circuitry (e.g., channel elements 134 of transistors 130 that form the readout line 180) of the photon counting device 100. The transistor 130 is capable of GHz-rate operation and has zero or negligible current leakage between the superconducting gate element 132 and the channel element 134 of the transistor 130. Additional details regarding the structure and operation of the transistor 130 is provided in U.S. Pat. No. 10,461,445, which is incorporated by reference.

In some embodiments, the channel element 134 of the transistor 130 is a superconducting wire that is biased below a threshold current (e.g., a threshold current density, a hotspot plateau current), which allows for operation of the transistor 130 in a non-latched state.

The superconducting gate element 132 includes (e.g., is composed of) a superconducting material). Thus, the superconducting gate element 132 has a zero or negligible resistance while the superconducting gate element 132 is in the superconducting state and the superconducting gate element 132 has a non-zero or non-negligible resistance while the superconducting gate element 132 is in the non-superconducting state.

In some embodiments, the channel element 134 has a first resistance R while the channel element 134 is in a first state and a second resistance R' that is different from the first resistance R while the channel element 134 is in a second state that is different from the first state. In some embodiments, the channel element 134 is in the first state while the superconducting gate element 132 is in the superconducting state and the channel element 134 is in the second state while the superconducting gate element 132 is in the non-superconducting state.

In some embodiments, the channel element 134 is a superconducting channel element 134 (e.g., is composed of a superconducting material). In such cases, the first state is a superconducting state and the second state is a non-superconducting state. Thus, the superconducting channel element 134 that has a first resistance R that is zero or negligible while the channel element 134 is in a superconducting state (e.g., the first state) and a second resistance R' that is greater than the first resistance R (e.g., resistance R' is non-zero or non-negligible) while the channel element 134 is in a non-superconducting state (e.g., the second state). In some embodiments, second resistance R' is a predefined resistance.

In some embodiments, the channel element 134 is a semiconductor channel element 134 (e.g., is composed of a semiconductor material). In such cases, the first state is a state where the temperature of the semiconductor channel element 134 is below a first temperature and has a resistance R, and the second state is a state where the temperature of the semiconductor channel element 134 is above the first temperature and has a resistance R'. For example, the first temperature may be a semiconducting threshold temperature, above which the semiconductor channel becomes conductive, or has low resistance, and below which the semiconductor channel is substantially non-conductive, or has high resistance). Additional information concerning transistors having a superconducting gate and semiconducting channel can be found in U.S. Patent Publication US2019/0035999A1, which is hereby incorporated by reference in its entirety.

In some embodiments, the semiconductor channel element 134 is designed such the temperature of the semiconductor channel element 134 increases above the first temperature in response to heat being is transmitted (e.g., transferred) from the superconducting gate element 132 to the semiconductor channel element 134 due to transition of the superconducting gate element 132 from the superconducting state to the non-superconducting state.

In some embodiments, the channel element 134 is coupled (e.g., electrically coupled to, electrically connected to) to a resistive element 136 that has a resistance r. The resistance r of resistive element 136 is selected, or configured, such that detection current ($I_{det}$) is transmitted primarily (e.g., more than 80%, or 90%) through the resistive element 136 while the channel element 134 of the transistor 130 has a resistance (R or R') that is greater than a resistance r of the resistive element 136, and is primarily transmitted (e.g., more than 80%, or 90%) through the channel element 134 of the transistor 130 while the channel element 134 of the transistor 130 has a resistance (R or R') that is smaller than a resistance r of the resistive element 136.

In some embodiments, such as when the channel element 134 is a superconducting channel element, the resistance r of the resistive element 136 is larger than (e.g., greater than) the resistance R of the superconducting channel element 134 while the superconducting channel element 134 is in the superconducting state (e.g., the first state), and the resistance r of the resistive element 136 is smaller than (e.g., less than) the resistance R' of the superconducting channel element 134 while the superconducting channel element 134 is in the non-superconducting state (e.g., the second state). For example, in some embodiments in which the channel element 134 is a superconducting channel element, the resistance r is at least five times, or ten times the resistance R, and the resistance R' is at least five times, or ten times the resistance r.

Thus, while the superconducting channel element 134 is in the superconducting state (e.g., the first state) and has a resistance R, at least a portion of the detection current ($I_{det}$) is transmitted through the superconducting channel element 134, and while the superconducting channel element 134 is in the non-superconducting state (e.g., the second state) and has a resistance R', at least a portion of the detection current ($I_{det}$) is transmitted through the resistance element 136 having a resistance r (e.g., instead of being transmitted through the superconducting channel element 134 of the transistor 130). For example, in response to the superconducting channel element 134 transitioning from the superconducting state (e.g., the first state) to the non-superconducting state (e.g., the second state), at least a portion of the detection current ($I_{det}$) is redirected towards the resistance element 136. In some embodiments, the superconducting channel element 134 is designed such that the resistance R' of the channel element 134 of the superconducting channel element 134 while the superconducting channel element 134 is in a non-superconducting state (e.g., the second state) is larger than the resistance r of the resistive element 136 (e.g. the resistance R' is predetermined and/or predefined to be larger than r; in some embodiments, the resistance R' is predetermined and/or predefined to be at least five times, or ten times the resistance r).

For example, when the channel element 134 of the transistor 130 is a superconducting channel element 134, in response to the superconducting gate element 132 transitioning from the superconducting state to a non-superconducting state, a temperature of the superconducting gate element 132 increases and heat is transferred from the superconducting gate element 132 to the superconducting channel element 134. In response to a temperature of the superconducting channel element 134 exceeding a superconducting threshold temperature of the superconducting channel element 134, the superconducting channel element 134 transitions from the superconducting state to the non-superconducting state. In response to the superconducting channel element 134 transitioning from the superconducting state to the non-superconducting state, the detection current ($I_{det}$) is substantially redirected (e.g., at least 80%, or 90% is redirected) from the superconducting channel element 134 to the resistive element 136.

In some embodiments, such as when the channel element 134 is a semiconductor channel element 134, the resistance r is smaller than (e.g., lesser than) the resistance R such that while the temperature of the semiconductor channel element 134 of the transistor 130 is below the first temperature and the semiconductor channel element 134 has a resistance R (e.g., while the semiconductor channel element 134 is in the first state), at least a portion of the detection current ($I_{det}$) is transmitted through the resistance element 136 having a resistance r. When the channel element 134 is a semiconductor channel element 134, the resistance r is larger than (e.g., greater than) the resistance R' such that while the temperature of the semiconductor channel element 134 of the transistor 130 is above the first temperature and has a resistance R' (e.g., while the semiconductor channel element 134 is in the second state), at least a portion of the detection current ($I_{det}$) is transmitted through the semiconductor channel element 134 of the transistor 130 having a resistance R' (e.g., instead of being transmitted through the resistance element 136 having a resistance r). For example, in response to an increase in the temperature of the semiconductor channel element 134 from below the first temperature to above the first temperature (e.g., transitioning from the first state to the second state), at least a portion (e.g., at least 80%, or 90%) of the detection current ($I_{det}$) is redirected towards the semiconductor channel element 134. In some embodiments, the semiconductor channel element 134 is designed such that the resistance R' of the semiconductor channel element 134, while the semiconductor channel element 134 is in the second state, is smaller than the resistance r of the resistive element 136 (e.g. the resistance R' is predetermined and/or predefined to be smaller than r). For example, in some embodiments in which the channel element 134 is a semiconducting channel element, the resistance R is at least five times, or ten times the resistance r, and the resistance r is at least five times, or ten times the resistance R'.

For example, when the channel element 134 of the transistor 130 is a semiconductor channel element 134, in response to the superconducting gate element 132 transitioning from the superconducting state to a non-superconducting state, a temperature of the superconducting gate element 132 increases and heat is transferred from the superconducting gate element 132 to the semiconductor channel element 134. In response to the temperature of the semiconductor channel element 134 increasing above the first temperature, the resistance of the semiconductor channel element 134 is decreased from R to R', where the resistance R' is smaller than the resistance r of the resistive element 136. In response to the decrease in the resistance of the semiconductor channel element 134, the detection current ($I_{det}$) is substantially redirected (e.g., at least 80%, or 90%) from the resistive element 136 to the semiconductor channel element 134.

FIGS. 4A-4D are circuit diagrams of dynamics control components 140 of the photon counting device 100 shown in FIG. 1 in accordance with some embodiments. The current dynamics control element 140 determines a predefined relaxation time (e.g., recovery time) of a respective unit cell 110, such as any of unit cells 110-1 to 110-n. The predefined relaxation time of the unit cell 110 corresponds to (e.g., is related to, is the same as) the relaxation time (e.g., relaxation constant, time constant) of the current dynamics control element 140. Examples of current dynamics control elements 140-A, 140-B, 140-C, and 140-D, each of which correspond to current dynamics control element 140, are described below with respect to FIGS. 4A-4D, respectively.

Figure 4D:
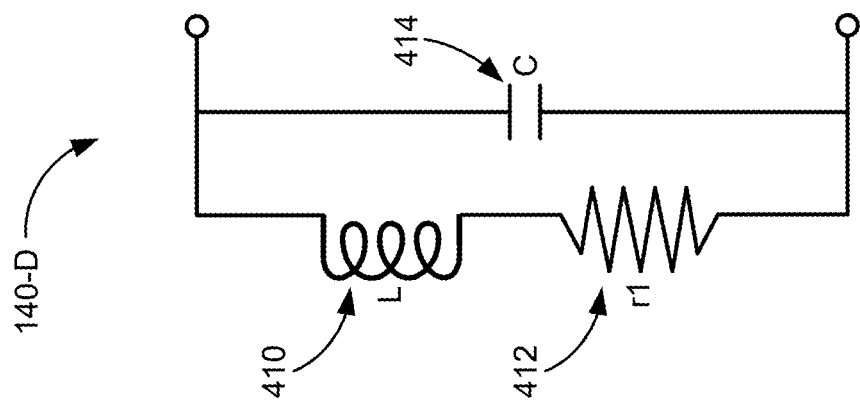
FIGS. 4A-4D are circuit diagrams of dynamics control components of the photon counting device shown in FIG. 1 in accordance with some embodiments.
Figure 4C:
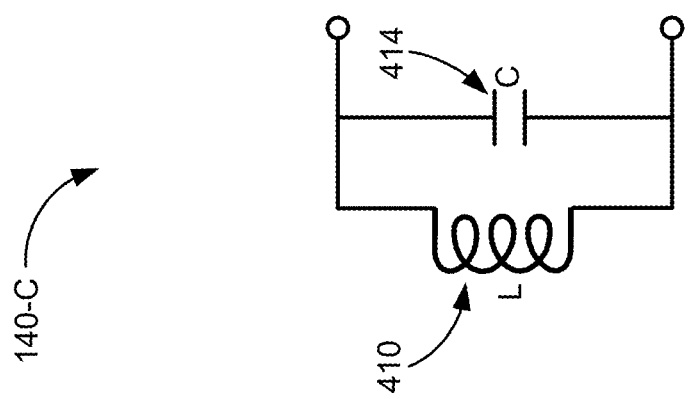
Figure 4B:
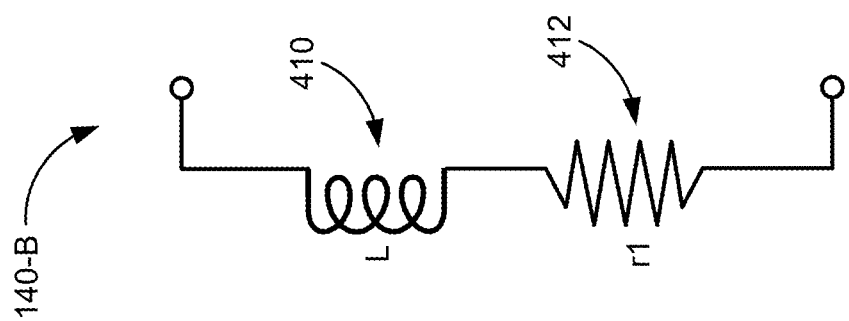
Figure 4A:
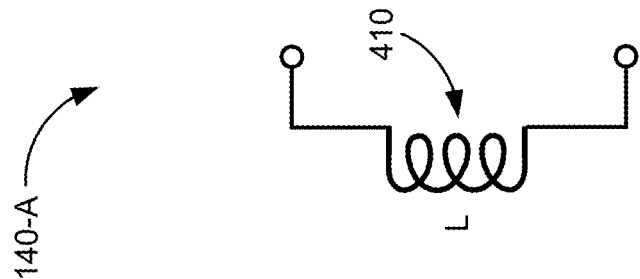

In some embodiments, as shown in FIG. 4A, the current dynamics control element 140-A includes an inductor 410. In such cases, the relaxation time of the unit cell 110 is correlated with the inductance, L, of the inductor 410 of the current dynamics control element 140 and a total resistance of the unit cell 110.

In some embodiments, as shown in FIG. 4B, the current dynamics control element 140-B includes an inductor 410 and a resistor 412 coupled in series with one another. In such cases, the relaxation time of the unit cell 110 is correlated with the inductance, L, of the inductor 410 of the current dynamics control element 140 and a total resistance of the unit cell 110-n, including the resistance, $r_1$, of the resistor 412.

In some embodiments, as shown in FIG. 4C, the current dynamics control element 140-C includes an inductor 410 and a capacitor 414 coupled in parallel to one another. In such cases, the relaxation time of the unit cell 110 is correlated with the inductance, L, of the inductor 410 and a capacitance, C, of the capacitor 414.

In some embodiments, as shown in FIG. 4D, the current dynamics control element 140-D includes a capacitor 414 that is coupled in parallel to an inductor 410 and a resistor 412, where the inductor 410 and resistor 412 are connected in series. In such cases, the relaxation time of the unit cell 110-n is correlated with the inductance, L, of the inductor 410, a capacitance, C, of the capacitor 414, and a total resistance of the unit cell 110-n, including the resistance, $r_1$, of the resistor 412.

Figure 5A:
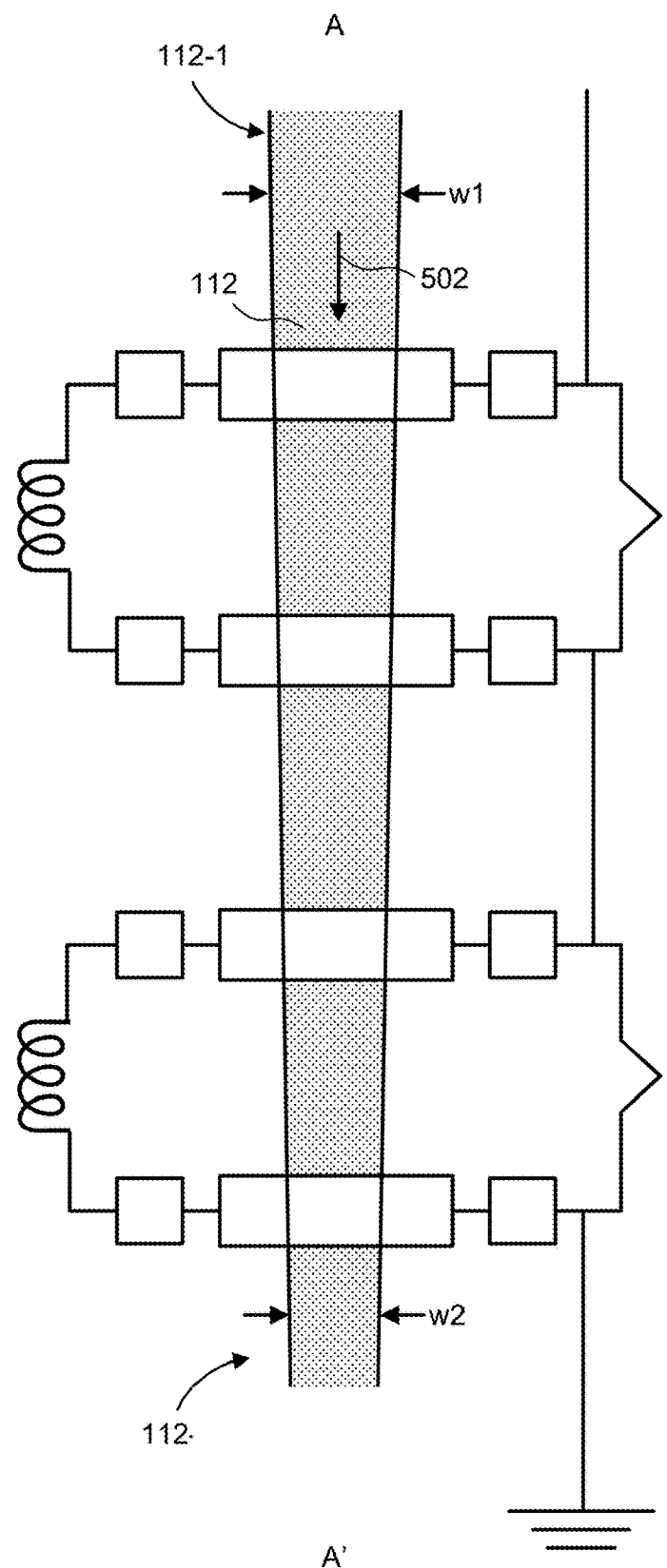
FIG. 5A illustrates a tapered waveguide that is coupled to the photon counting device shown in FIG. 1 in accordance with some embodiments.

FIG. 5A illustrates a tapered waveguide 112 that is coupled to the photon counting device 100 shown in FIG. 1 in accordance with some embodiments. In some embodiments, the waveguide 112 is a tapered waveguide 112, as illustrated in FIG. 5A. The tapered waveguide has a first portion 112-1 (e.g., a first end) that has a first width (e.g., lateral width) $w_1$, and a second portion 112-2 (e.g., a second end) that has a second width (e.g., lateral width) $w_2$ that is different from (e.g., smaller than) the first width $w_1$. In some embodiments, the tapered waveguide has a tapered profile that smoothly transitions from the first width $w_1$ to the second width $w_2$. For example, the tapered waveguide 112 may have a linear profile, as shown in FIG. 5A. Other possible profiles for the tapered waveguide 112 include a parabolic profile, an exponential profile, or other non-linear profiles. In some embodiments, the profile of the tapered waveguide 112, including the first width $w_1$ and the second width $w_2$, is configured (e.g., designed) such that the coupling efficiency (e.g., light coupling efficiency, optical coupling efficiency) between the waveguide 112 and the photodetectors 120 of the photon counting device 100 is substantially equal for each photon that is guided by waveguide 112.

Figure 5B:
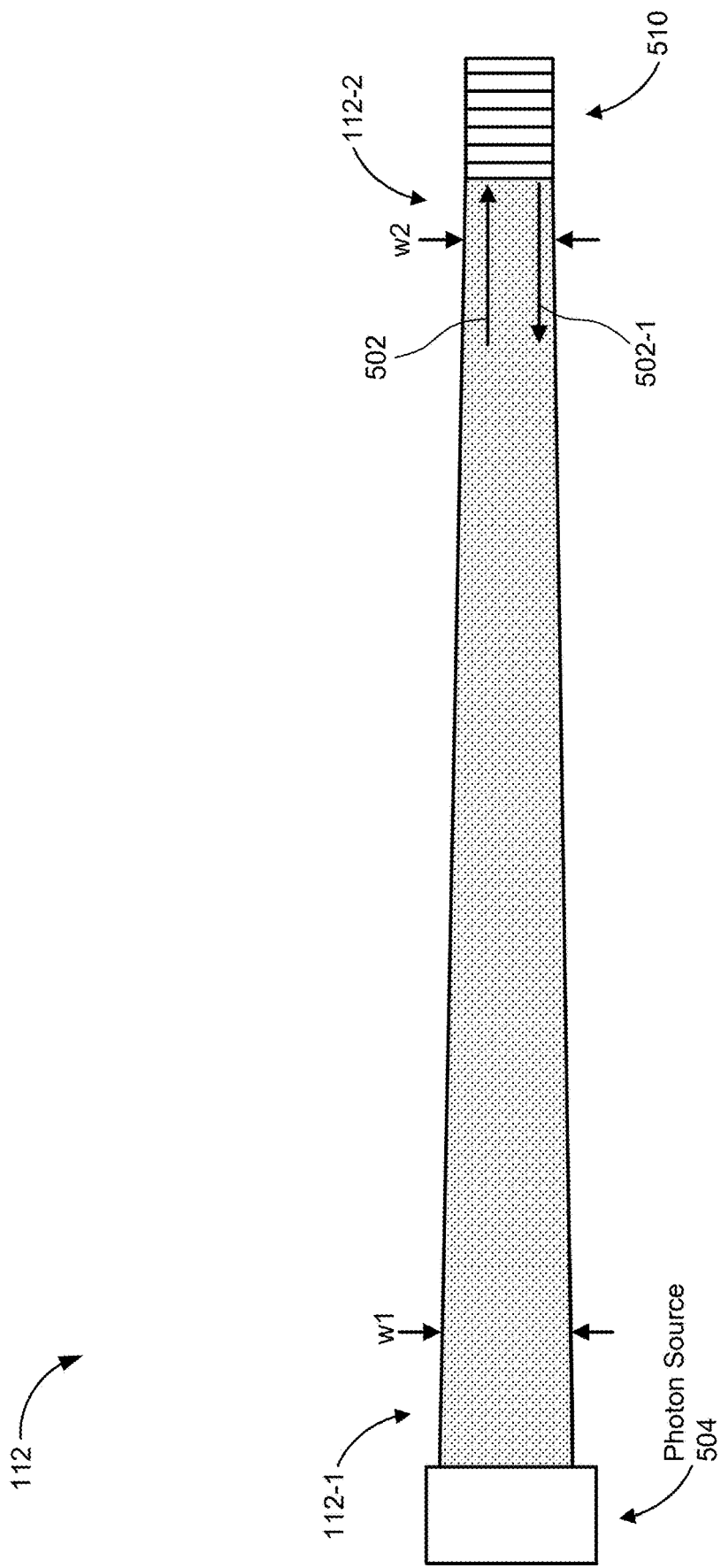
FIG. 5B illustrates a waveguide with a Bragg mirror in accordance with some embodiments.
Figure 5C:
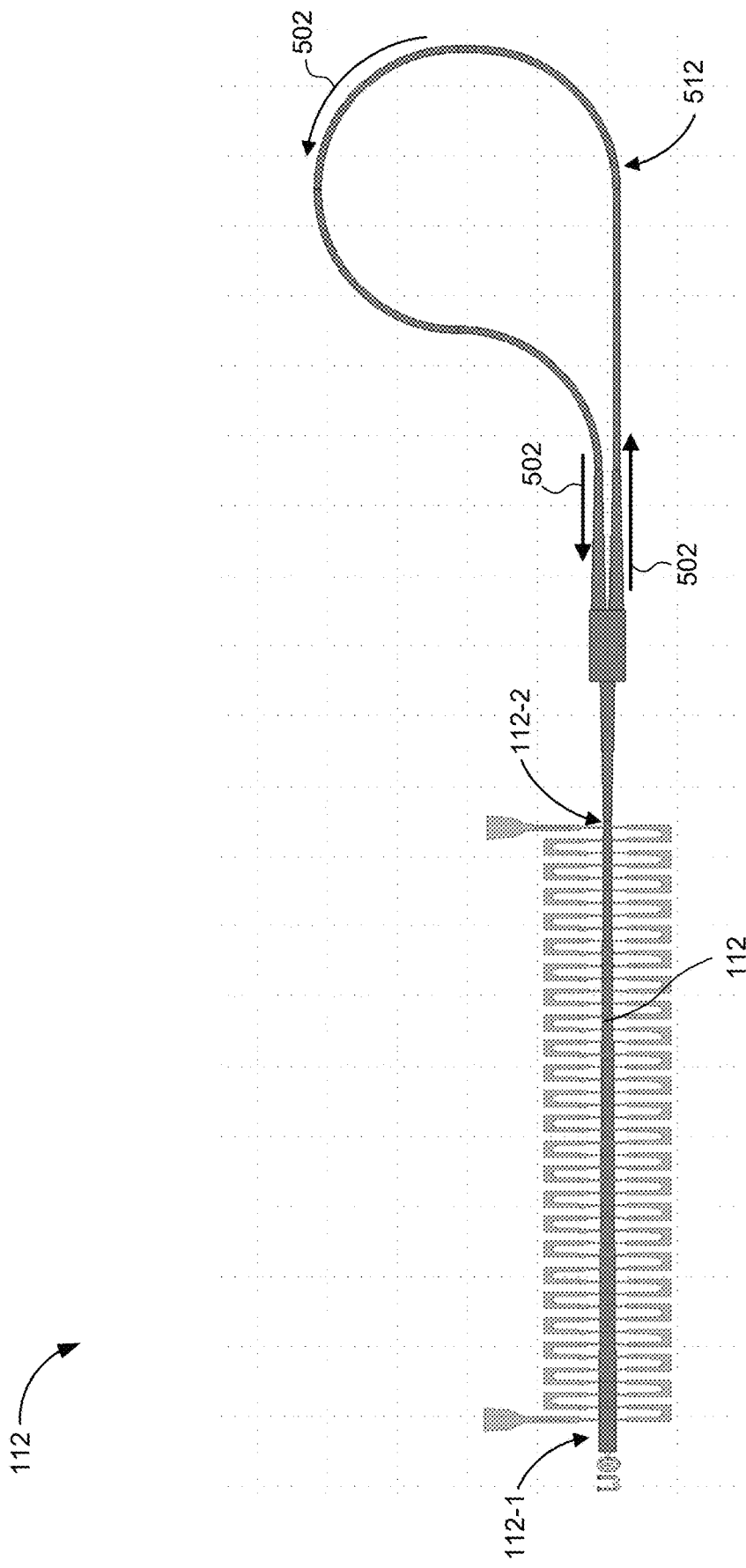
FIG. 5C illustrates a waveguide with a loop mirror in accordance with some embodiments.

The tapered waveguide 112 is configured to transmit light from one end of the waveguide 112 to the other end of the waveguide 112 (e.g., from first portion 112-1 to second portion 112-2, or vice versa). In some embodiments, the tapered waveguide 112 is positioned relative to the unit cells 110 such that light is propagated from the first portion 112-1 having the first width $w_1$ to the second portion 112-2 having the second width $w_2$ (e.g., light is guided through the first portion 112-1 of the tapered waveguide 112 before being guided through the second portion 112-2 of the tapered waveguide 112). The propagation direction of light guided through tapered waveguide 112 is represented by arrow 502. In some embodiments, the first portion 112-1 of the tapered waveguide 112 may be coupled (e.g., optically coupled, directly or indirectly) to a photon source. In some embodiments, the second portion 112-2 of the tapered waveguide 112 may be coupled (e.g., optically coupled, directly or indirectly) to a reflective component (e.g., reflector, mirror) configured to reflect light back into the waveguide 112. FIGS. 5B and 5C illustrate examples of waveguides 112 that are coupled to a reflective component.

FIG. 5B illustrates a waveguide 112 with a Bragg mirror 510 in accordance with some embodiments. A Bragg mirror 510 (e.g., distributed Bragg reflector) is a reflective element (e.g., reflector) that includes a plurality of layers with different (e.g., alternating) refractive indices. The Bragg mirror 510 is configured to be coupled (e.g., optically coupled) to the waveguide 112 so that any light guided by the waveguide 112 that is incident upon the Bragg mirror 510 is reflected back into the waveguide 112, allowing the reflected light to be propagated past the photon counting device 100 at least twice. For example, as shown in FIG. 5B, the first portion 112-1 of the tapered waveguide 112 is coupled (e.g., optically coupled, directly or indirectly) to a photon source 504 and the second portion 112-2 of the tapered waveguide 112 is coupled (e.g., optically coupled, directly or indirectly) to the Bragg mirror 510 such that light output from the photon source 504 and guided through the waveguide 112 is reflected at the Bragg mirror 510 back into the waveguide 112 and guided by the waveguide 112 back toward the photon source 504. Arrow 502 represents a propagation direction of light in the waveguide 112, and arrow 502-1 represents a propagation direction of light in the waveguide 112 after being reflected by the Bragg mirror 510.

FIG. 5C illustrates a waveguide 112 with a loop mirror 512 in accordance with some embodiments. A loop mirror 512 is a waveguide (e.g., optical waveguide, optical fiber) that is coupled (e.g., optically coupled, coupled via a splitter) to the waveguide 112 such that light is guided from the waveguide 112 into the loop mirror 512 and the light is guided by the waveguide of the loop mirror 512 back into the waveguide 112. The loop mirror 512 is configured to be coupled (e.g., optically coupled) to the waveguide 112 so that any light guided by the waveguide 112 that is incident upon (e.g., received by) the loop mirror 512 is reflected back into the waveguide 112, allowing light to be propagated past the photon counting device 100 at least twice. For example, as shown in FIG. 5C, the second portion 112-2 of the tapered waveguide 112 is coupled (e.g., optically coupled, directly or indirectly) to the loop mirror 512 such that light guided through the waveguide 112 is guided by the loop mirror 512 back into the waveguide 112 and is guided by the waveguide 112 back toward the photon source 504. Arrow 502 illustrates a propagation direction of light in the loop mirror 512.

FIG. 6A-6D are circuit diagrams illustrating operation of the photon counting device 100 shown in FIG. 1 in accordance with some embodiments. Operation of the photon counting device 100 includes maintaining the superconducting components 210 of the photodetectors 120 at a temperature that is below the threshold temperature of the superconducting components 210 (FIG. 2) of the photodetectors, and maintaining superconducting gate elements 132 of transistors 130 at a temperature that is below the threshold temperature of the superconducting gate elements 132 of transistors 130. The superconducting components 210 of the photodetectors 120 are biased (e.g., by the bias current, $I_{bias}$) below a current threshold of the superconducting components 210 of the photodetectors 120 such that an increase in current in a superconducting component 210 (e.g., due to absorption of a photon) causes the superconducting component 210 to exceed the current threshold of the superconducting component 210 and transition from the superconducting state to the non-superconducting state.

The superconducting gate 132 of the transistor 130 is configured to be in the non-superconducting state while the one or more photodetectors 120 (e.g. superconducting components 210 of the photodetectors 120) are in the non-superconducting state. The superconducting gate 132 of the transistor 130 is configured to transition from the non-superconducting state to the superconducting state in response to at least one of the photodetectors of the one or more photodetectors 120 (e.g. superconducting components 210 of the photodetectors 120) transitioning from the non-superconducting state to the superconducting state. Stated another way, the superconducting gate 132 of the transistor 130 is configured to transition from the non-superconducting state to the superconducting state when all of the superconducting components 210 of the one or more photodetectors 120 that were in the non-superconducting state transition to the superconducting state.

Figure 6A:
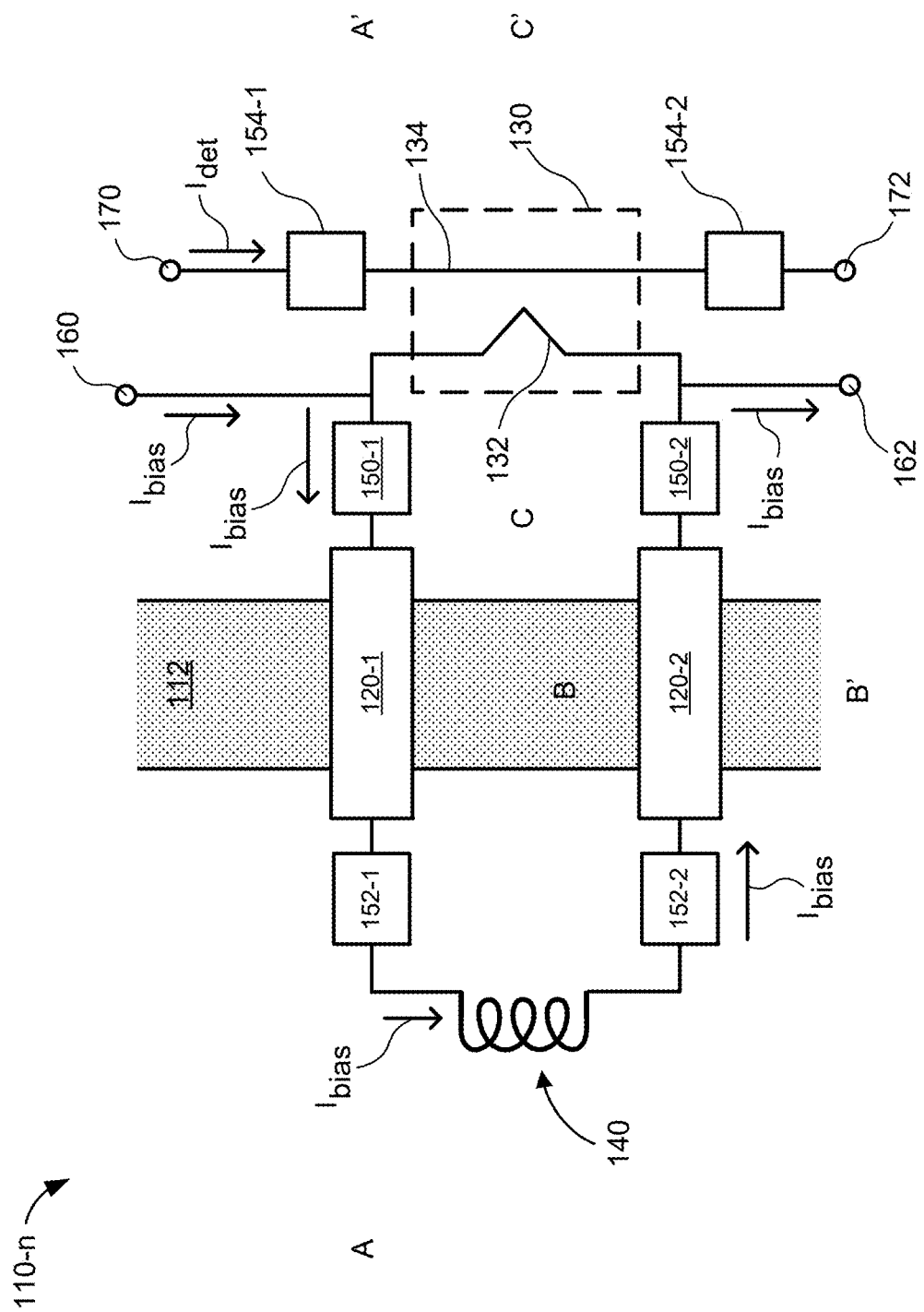
FIG. 6A-6D are circuit diagrams illustrating operation of the photon counting device shown in FIG. 1 in accordance with some embodiments.

Referring to FIG. 6A, the unit cell 110-$n$ is configured to receive the detection current ($I_{det}$) at an input terminal 170 at the readout line 180 and transmit the detection current ($I_{det}$) to an output terminal 172 of the readout line 180. Changes to the resistance of the readout line 180, for example, due to a change in resistance of the channel elements 134 of the transistors 130, are reflected in either the detection current ($I_{det}$), or in a voltage of the detecting current signal at the output terminal 172 of the readout line 180, depending, for example, on whether the detection current ($I_{det}$) is provided by a voltage source or current source.

In some embodiments, such as when the channel element 134 of the transistor 130 is a superconducting channel element 134, the detection current ($I_{det}$) is transmitted (e.g., primarily transmitted, as discussed above) through the superconducting channel element 134 while the superconducting channel element 134 is in a superconducting state (e.g., the first state) and has a resistance R that is smaller than a resistance r of the resistive element 136 (see FIG. 3), and is transmitted (e.g., primarily transmitted, as discussed above) through the resistive element 136 while the superconducting channel element 134 is in a non-superconducting state (e.g., the second state) and has a resistance R' that is greater than a resistance r of the resistive element 136. Thus, an electrical signal transmitted through the readout line 180 and corresponding to the detection current ($I_{det}$) is changed in response to a change in the resistance (e.g., increase in resistance) of the superconducting channel element 134 of the transistor 130 of a unit cell 110 due to a transition of the superconducting channel element 134 from the superconducting state (e.g. first state) to a non-superconducting state (e.g., second state), for example in response to detection of a photon by the unit cell 110 in which the transistor 130 is located.

In some embodiments, such as when the channel element 134 of the transistor 130 is a semiconductor channel element 134, the detection current ($I_{det}$) is transmitted through the resistive element 136 while the temperature of the semiconductor channel element 134 is below a temperature threshold and has a resistance R' that is greater than a resistance r of the resistive element 136 (e.g., the semiconductor channel element 134 is in the first state), and is transmitted through the semiconductor channel element 134 while the temperature of the semiconductor channel element 134 is above the threshold temperature and has a resistance R that is smaller than a resistance r of the resistive element 136 (e.g., the semiconductor channel element 134 is in the second state). Thus, an electrical signal transmitted through the readout line 180 and corresponding to the detection current ($I_{det}$) is changed in response to a change in the resistance (e.g., a decrease in resistance) of the semiconductor channel element 134 of the transistor 130 of a unit cell 110 due to an increase in temperature of the semiconductor channel element 134, for example in response to detection of a photon by the unit cell 110 in which the transistor 130 is located.

In some embodiments, the unit cell 110-n is also configured to receive the bias current ($I_{bias}$) at the bias current input terminal 160 of the unit cell 110-n and transmit the bias current ($I_{bias}$) to the bias current output terminal 162 of the unit cell 110-n. In some embodiments, as shown in FIG. 6A, an electrical path that includes the gate element 132 of the transistor 130 is configured to have a non-zero or non-negligible resistance such that the bias current ($I_{bias}$) is configured to be transmitted through an electrical path that includes the one or more photodetectors 120 while all of the one or more photodetectors 120 of the unit cell 110-n are in the superconducting state. For example, while the one or more photodetectors 120 are in the superconducting state, the total resistance of an electrical path that includes the one or more photodetectors 120 (and also includes the current dynamics control element 140 and thermal buffers 150 and 152) is less than (e.g., smaller than) the total resistance of an electrical path that includes the superconducting gate element 132 of the transistor 130. In some embodiments, the superconducting gate element 132 of the transistor 130 has a predefined resistance that is non-zero. For example, the gate element 132 may be a superconducting gate element 132 that has zero or negligible resistance and the electrical path that includes the superconducting gate element 132 may include one or more devices that have a non-zero resistance such that the total resistance of an electrical path that includes the gate element 132 of the transistor 130 is greater than the total resistance of an electrical path that includes the one or more photodetectors 120. In some embodiments, the total resistance of an electrical path that includes the gate element 132 of the transistor 130 is equal or greater (e.g., at least 5 times, 10 times, 15 times, 20 times, 50 times, 100 times, at least one order of magnitude, at least two orders of magnitude greater) than the total resistance of an electrical path that includes the one or more photodetectors 120.

Figure 6B:
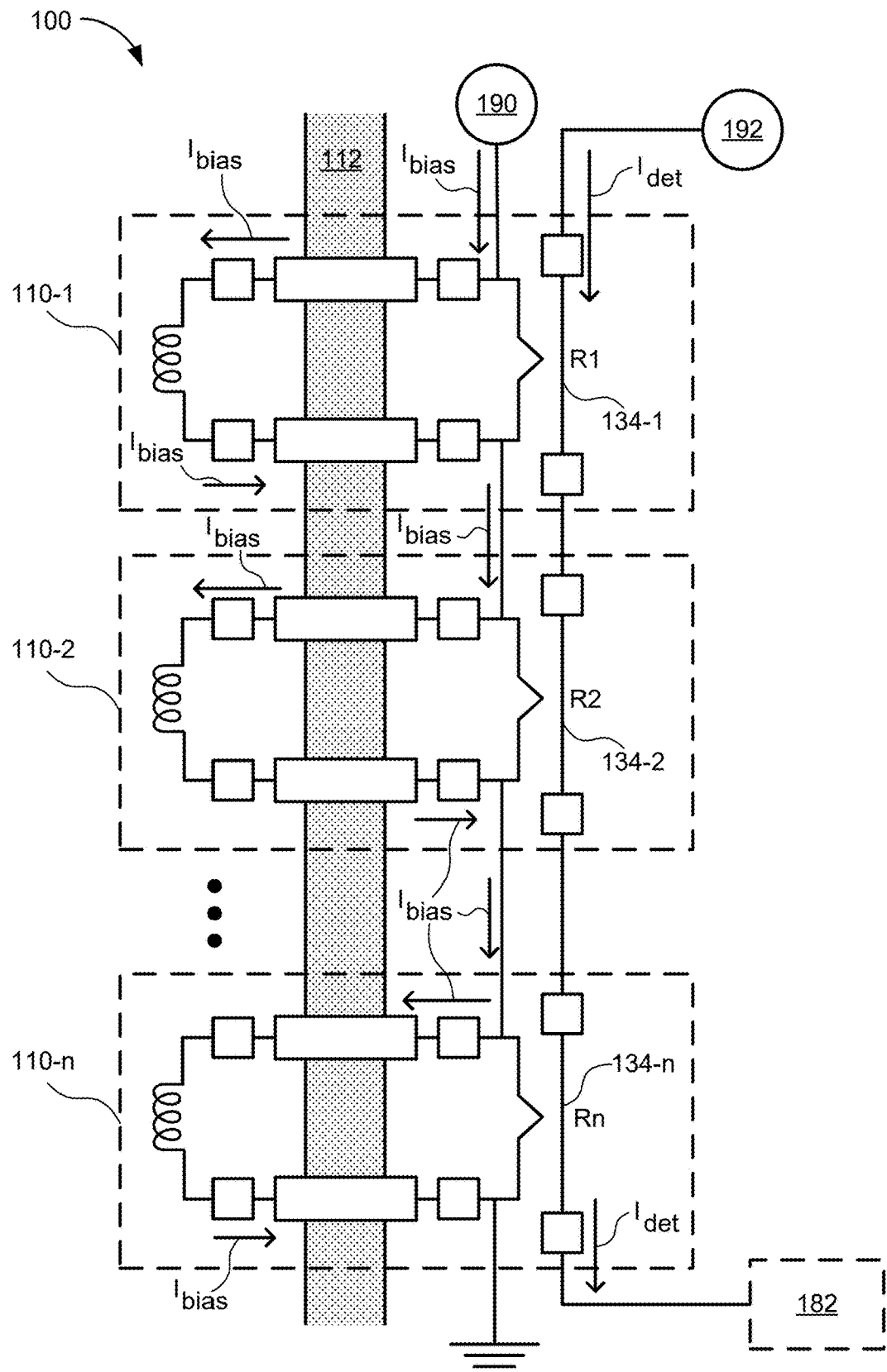

FIG. 6B illustrates the electrical path of the bias current ($I_{bias}$) while all of the photodetectors 120 of the photon counting device 100 are in the superconducting state (e.g., during steady state operation of the photon counting device 100). For example, while the superconducting components 210 (e.g., nanowires) of photodetectors 120 are maintained at a temperature below the threshold temperature of the photodetectors 120, and light is not incident upon (e.g., absorbed by) any of the superconducting components 210 (e.g., nanowires) of photodetectors 120, all of the photodetectors 120 of the photon counting device 100 are in the superconducting state and the bias current ($I_{bias}$) is transmitted through each unit cell 110-n via the one or more photodetectors 120 of the unit cell 110-n as described with respect to FIG. 6A. In some embodiments, while all of the photodetectors 120 of the photon counting device 100 are in the superconducting state (e.g., because no photons have been detected), the channel elements 134 of the transistors 130 in all the unit cells of a photon counting device have zero resistance.

Figure 6C:
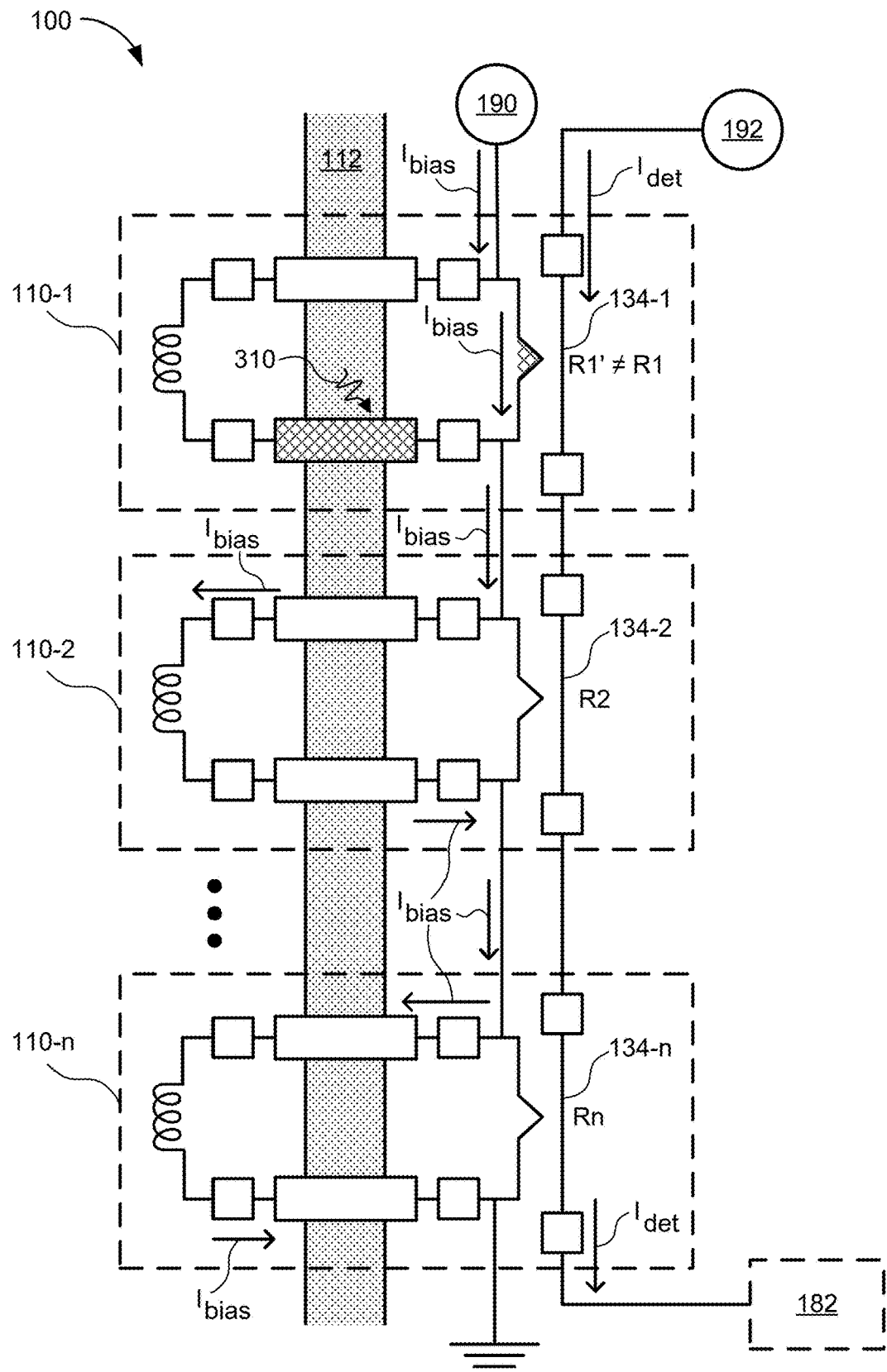

FIG. 6C illustrates the path of the bias current ($I_{bias}$) in the photon counting device 100 when light is incident upon (e.g., detected or absorbed by) at least one photodetector 120 (e.g., in response to light being incident upon at least one photodetector 120 of the photon counting device 100). In this example, a photodetector 120 of the first unit cell 110-1 detects (e.g., absorbs) at least a portion of light propagating in the waveguide 112 (e.g., light is incident upon a photodetector 120 of the first unit cell 110-1). In response to detecting light (e.g., absorbing a photon), the photodetector 120 transitions from the superconducting state to the non-superconducting state. Detection (e.g., absorption) of light at the photodetector 120 increases the amount of current carried in the photodetector 120 above a current threshold (e.g., a current density threshold, a critical current threshold) of the photodetector 120 such that the photodetector 120 transitions to the non-superconducting state. In response to the photodetector 120 transitioning from the superconducting state to the non-superconducting state, at least a portion of the bias current ($I_{bias}$) in the first unit cell 110-1 is redirected from the one or more photodetectors 120 to the superconducting gate element 132 of the transistor 130. In some embodiments, at least a portion, less than all, of the bias current ($I_{bias}$) is redirected from the one or more photodetectors 120 to the superconducting gate element 132 of the transistor 130. In some embodiments, substantially all (e.g., at least 80%, or 90%) of the bias current ($I_{bias}$) is redirected from the one or more photodetectors 120 to the superconducting gate element 132 of the transistor 130. In response to at least a portion of the bias current ($I_{bias}$) being redirected from the one or more photodetectors 120 to the superconducting gate element 132 of the transistor 130, the amount of current carried by the superconducting gate element 132 of the transistor 130 is increased above a current threshold (e.g., a current density threshold, a critical current threshold) of the superconducting gate element 132 of the transistor 130 such that the superconducting gate element 132 of the transistor 130 transitions from the superconducting state to the non-superconducting state. In response to the superconducting gate element 132 of the transistor 130 transitioning from the superconducting state to the non-superconducting state, a non-negligible amount of heat is transferred between the superconducting gate element 132 of the transistor 130 and the channel element 134 of the transistor 130. In response to an increase in temperature of the channel element 134 of the transistor 130 due to transfer of heat between the superconducting gate element 132 and the channel element 134 of the transistor, the resistance of the channel element 134 of the transistor changes from R1 to R1', as described above with respect to FIG. 3. The change in the resistance of the channel element 134 of the transistor from R1 to R1' affects the signal (e.g., detection current $I_{det}$) carried by the readout line 180 and thus, the change in the resistance of the channel element 134 of the transistor from R1 to R1' can be detected by a circuit 182 that is configured to receive signals (e.g., electrical signals) from the readout line 180.

While the bias current ($I_{bias}$) is redirected from the one or more photodetectors 120 to the superconducting gate element 132 of the transistor 130 in the first unit cell 110-1, the bias current ($I_{bias}$) is transmitted through the one or more photodetectors 120 in the other unit cells 110 (e.g., subsequent and/or preceding unit cells) as described above with respect to FIGS. 6A and 6B. Thus, detection (e.g., absorption) of light (e.g., a photon) at a photodetector 120 of the first unit cell 110-1 does not affect operation of the other unit cells 110 in the photon counting device 100.

Figure 6D:
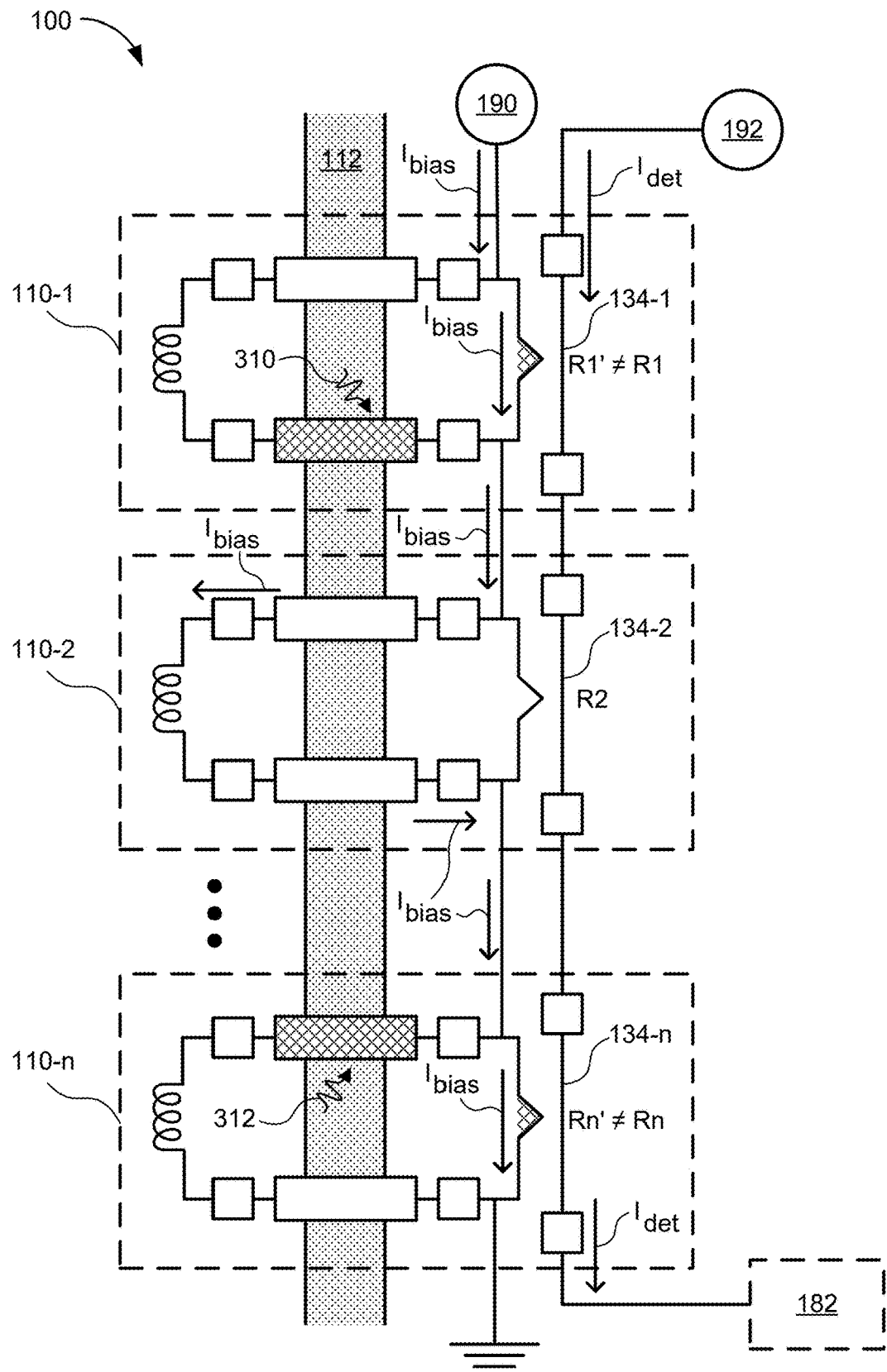

FIG. 6D illustrates the path of the bias current ($I_{bias}$) in the photon counting device 100 when light is incident upon photodetectors 120 in a plurality of unit cells 110 (e.g., in response to a photon being detected or absorbed by photodetectors 120 in two or more of unit cells 110). In this example, a photodetector 120 of the first unit cell 110-1 detects (e.g., absorbs) a portion (e.g., at least a portion) of light (e.g., a first photon) propagating in the waveguide 112 and a photodetector 120 of another unit cell 110-n detects (e.g., absorbs) another portion of light (e.g., a second photon, distinct from the first photon) propagating in the waveguide 112. In response to detection (e.g., absorption) of the first photon at a photodetector 120 of the first unit cell 110-1, at least a portion of the bias current ($I_{bias}$) is redirected from the one or more photodetectors 120 of the first unit cell 110-1 toward the superconducting gate element 132 of the transistor 130 of the first unit cell 110-1, leading to a change in the resistance of the channel element 134 of the transistor 130 of the first unit cell 110-1 from R1 to R1', as described above with respect to FIG. 6C. Similarly, in response to detection (e.g., absorption) of the second photon at a photodetector 120 of the unit cell 110-n, at least a portion of the bias current ($I_{bias}$) is redirected from the one or more photodetectors 120 of the unit cell 110-n toward the superconducting gate element 132 of the transistor 130 of the unit cell 110-n, leading to a change in the resistance of the channel element 134 of the transistor 130 of the unit cell 110-n from Rn to Rn'. The unit cell 110-n responds to detection of the second photon at a photodetector 120 of the unit cell 110-n in a similar (e.g., same) way as the first unit cell 110-1 responds to detection of the first photon at a photodetector 120 of the first unit cell 110-1. Thus, the response of unit cell 110-n to detection (e.g., absorption) of the second photon at a photodetector 120 of the unit cell 110-n is the same as the response of the first unit cell 110-1 to detection (e.g., absorption) of the first photon at a photodetector 120 of the first unit cell 110-1, as discussed above with respect to FIG. 6C.

In some embodiments, the channel elements 134 of the transistors 130 have a same resistance when the channel elements 134 are in the first state. For example, while channel elements 134-1, 134-2, and 134-n are in the first state, the channel elements 134-1, 134-2, and 134-n (e.g., R1, R2, and Rn) have the same resistance (e.g., have a same value, are equal to each other). For example, when the channel elements 134 are in the first state (e.g., during steady state operation of the photon counting device 100), the resistance of the channel elements 134-1, 134-2, and 134-n (e.g., R1, R2, and Rn) is zero (e.g., zero Ohms). In some embodiments, the channel elements 134 of the transistor 130 have a same resistance while the channel elements 134 are in the second state. For example, when channel elements 134-1, 134-2, and 134-n are in the second state, the channel elements 134-1, 134-2, and 134-n (e.g., R1', R2', and Rn') have the same resistance (e.g., have a same value, are equal to each other).

In some embodiments, while a first channel element 134-1 of a first transistor 130 is in the first state, the first channel element 134-1 has a resistance R1 that is different from the resistance Rn of another channel element 134-n of another transistor 130-n while the other channel element 134-n is in the first state. In some embodiments, while the first channel element 134-1 is in the second state, the first channel element 134-1 has a resistance R1' that is different from the resistance Rn' of another channel element 134-n of another transistor 130-n while the other channel element 134-n is in the second state.

While the bias current ($I_{bias}$) is redirected from the one or more photodetectors 120 to the superconducting gate element 132 of the transistor 130 in the first unit cell 110-1 and in the unit cell 110-n, the bias current ($I_{bias}$) is transmitted through the one or more photodetectors 120 in the other unit cells 110 (e.g., subsequent and/or preceding unit cells) as described above with respect to FIGS. 6A and 6B. Thus, detection (e.g., absorption) of light (e.g., a photon) at a photodetector 120 of the first unit cell 110-1 does not affect operation of the other unit cells 110 in the photon counting device 100.

In some embodiments, the photon counting device 100 includes a circuit 182 that is configured to receive the electrical signal transmitted through the readout line 180 (e.g., circuit 182 is configured to receive the detection current ($I_{det}$) transmitted through the readout line 180). The circuit 182 includes one or more components configured to detect the transient behavior of the unit cells (e.g., change in the resistance of the channel elements 134 from R to R') in response to detection of a photon by photodetectors 120 of the unit cells. Since the response of the unit cells is transient, the behavior of the unit cells in response to detection of a photon by photodetectors 120 can be detected in an AC portion of the electrical signal (e.g., detection current, $I_{det}$) transmitted through readout line 180 to circuit 182. Thus, circuit 182 may include one or more components configured to generate a signal that is representative of or corresponds to the AC component of the electrical signal transmitted through the readout line 180. For example, circuit 182 may include one or more components configured to remove a DC component or a DC offset of the electrical signal (e.g., detection current, $I_{det}$) received at the circuit 182 from the readout line 180.

FIGS. 7A-7D are circuit diagrams illustrating operation of the photon counting device 100 shown in FIG. 1 in accordance with some embodiments.

Figure 7A:
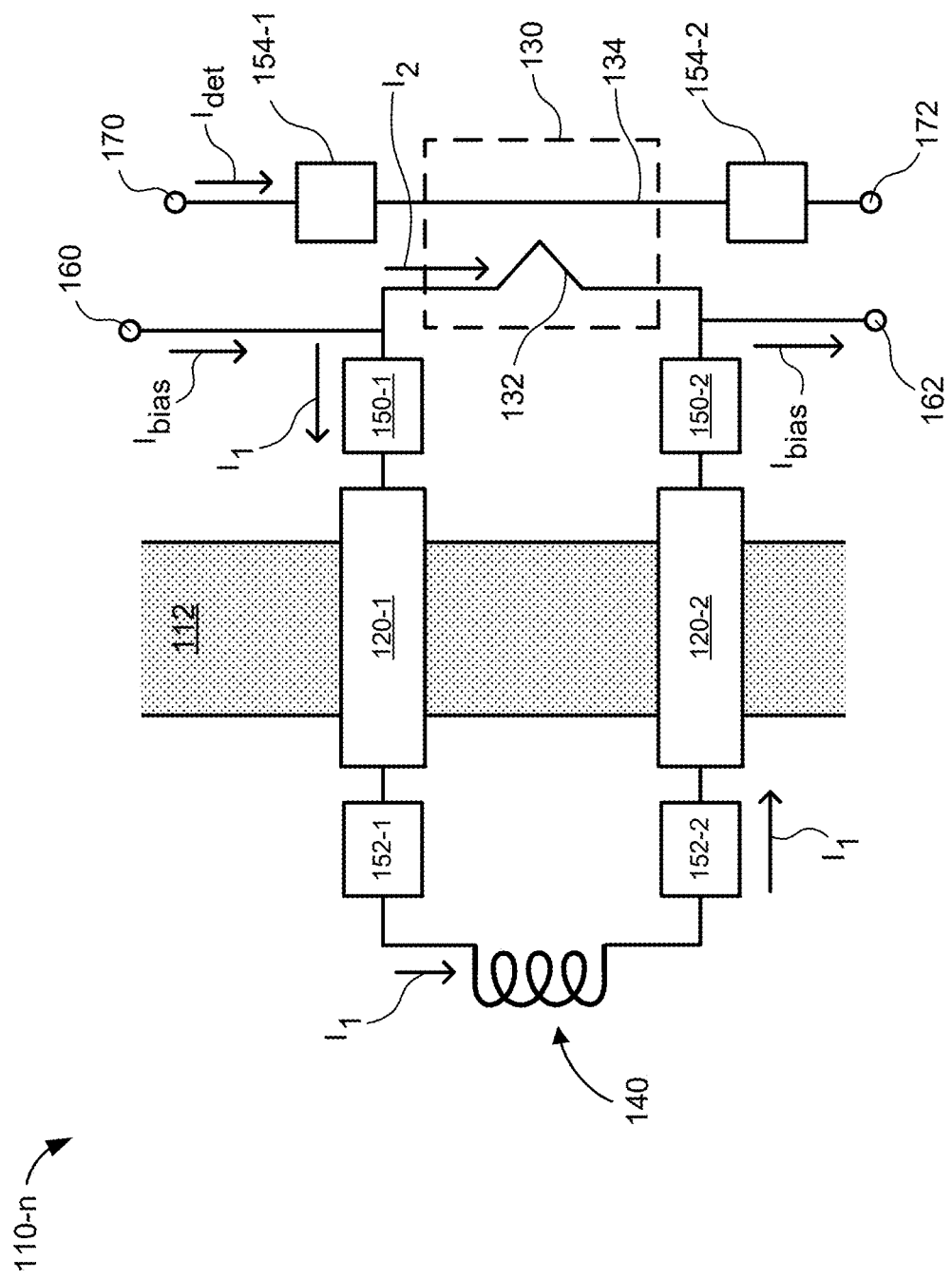
FIGS. 7A-7D are circuit diagrams illustrating operation of the photon counting device shown in FIG. 1 in accordance with some embodiments.

Referring to FIG. 7A, the unit cell 110-n is configured to receive the detection current ($I_{det}$) at an input terminal 170 at the readout line 180 and transmit the detection current ($I_{det}$) to an output terminal 172 at the readout line 180 as described above with respect to FIG. 6A. Details regarding behavior of the electrical signal transmitted through the readout line 180 and corresponding to the detection current ($I_{det}$) in response to a change in the resistance of the channel element 134 of the transistor 130 of a unit cell 110 is also provided above with respect to FIGS. 6A-6D.

The unit cell 110-n is configured to receive the bias current ($I_{bias}$) at the bias current input terminal 160 of the unit cell 110-n and transmit the bias current ($I_{bias}$) to the bias current output terminal 162 of the unit cell 110-n. In some embodiments, the electrical path that includes the superconducting gate element 132 of the transistor 130 and the electrical path that includes the one or more photodetectors 120 are configured to have a similar resistance (e.g., the same as, or differing by less than 20%, or 10%) while all of the one or more photodetectors 120 of the unit cell 110-n and the superconducting gate element 132 of the transistor 130 are in the superconducting state. For example, while the all of the photodetectors 120 of the one or more photodetectors 120 of the unit cell 110-n are in the superconducting state, the total resistance of an electrical path that includes the one or more photodetectors 120 (and also includes the current dynamics control element 140 and thermal buffers 150 and 152) is substantially the same as (e.g., the same as, or differing by less than 20%, or 10%) the total resistance of an electrical path that includes the superconducting gate element 132 of the transistor 130 while the superconducting gate element 132 is in the superconducting state. In such cases, a first portion (I1) of the bias current ($I_{bias}$) is configured to be transmitted through the electrical path that includes the superconducting gate element 132 of the transistor 130 and a second portion (I2) of the bias current ($I_{bias}$), distinct from the first portion (I1) of the bias current ($I_{bias}$), is configured to be transmitted through the electrical path that includes the one or more photodetectors 120 while all of the one or more photodetectors 120 of the unit cell 110-n are in the superconducting state. For example, the electrical path that includes the superconducting gate element 132 of the transistor 130 may be configured to have a zero or negligible resistance while the superconducting gate element 132 is in the superconducting state and the electrical path that includes the one or more photodetector 120 may be configured to have a zero or negligible resistance while all photodetectors 120 of the one or more photodetectors 120 are in the superconducting state.

Figure 7B:
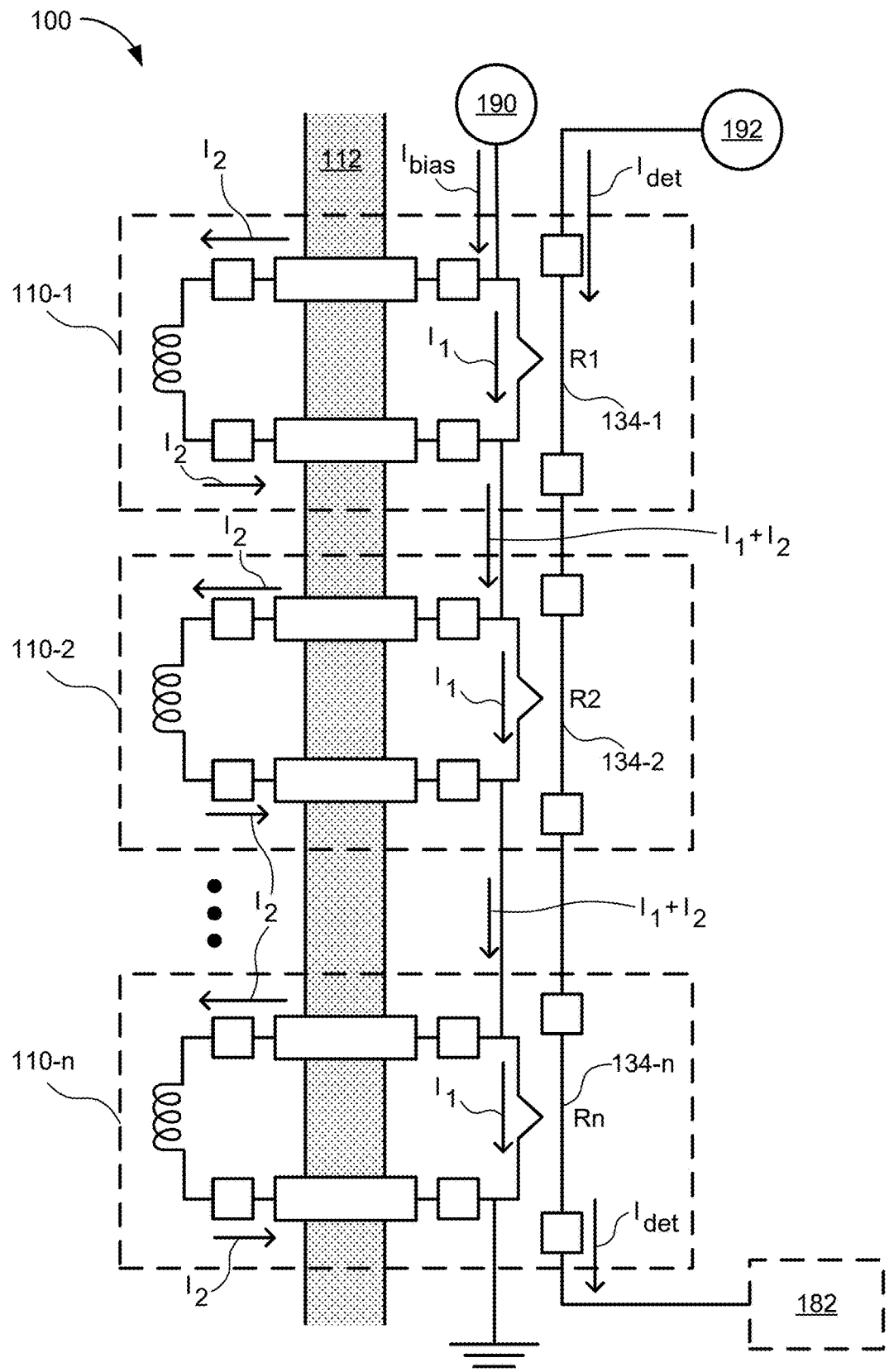

FIG. 7B shows the electrical path of the bias current ($I_{bias}$) when the superconducting components 210 of all of the photodetectors 120 in all of the unit cells 110 are in the superconducting state (e.g., during steady state operation of the photon counting device 100). For example, while the superconducting components 210 (e.g., nanowires) of photodetectors 120 are maintained at a temperature below the threshold temperature of the photodetectors 120, and light is not incident upon (e.g., absorbed by) any of the superconducting components 210 (e.g., nanowires) of photodetectors 120, all of the photodetectors 120 of the photon counting device 100 are in the superconducting state, the first portion (I1) of the bias current ($I_{bias}$) is transmitted through each unit cell 110-n via the one or more photodetectors 120 of the unit cell 110-n and the second portion (I2) of the bias current ($I_{bias}$) is transmitted through each unit cell 110-n via the superconducting gate elements 132 of the transistors 130 of the unit cell 110-n as described above with respect to FIG. 7A.

Figure 7C:
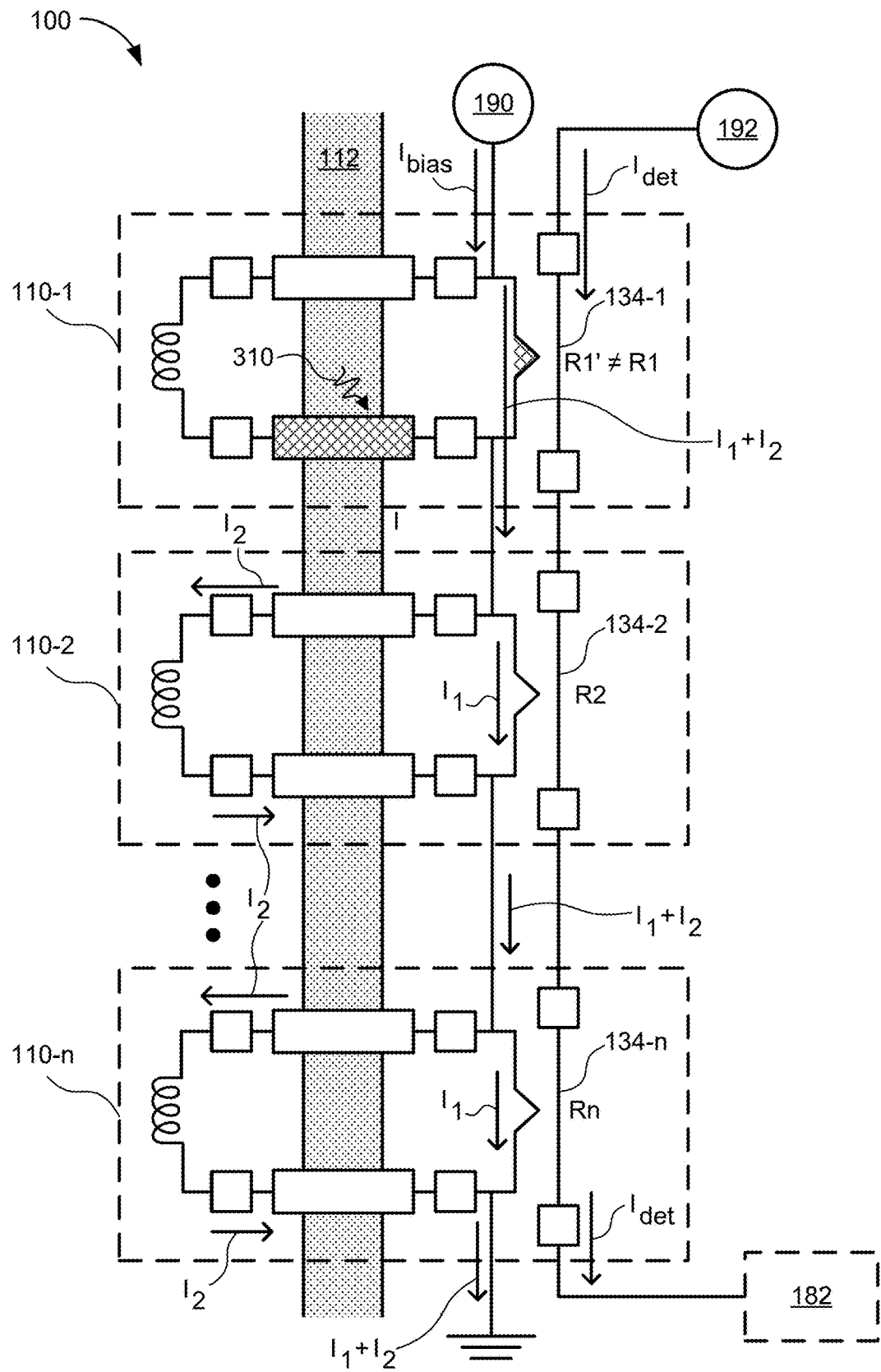

FIG. 7C illustrates the path of the bias current ($I_{bias}$) in the photon counting device 100 when light is incident upon (e.g., detected or absorbed by) at least one photodetector 120. In this example, a photodetector 120 of the first unit cell 110-1 detects (e.g., absorbs) at least a portion of light propagating in the waveguide 112. In response to detecting (e.g., absorbing) light (e.g., a photon) at the photodetector 120 (e.g., at the superconducting component or nanowire 210 of the photodetector 120), the photodetector 120 transitions from the superconducting state to the non-superconducting state. The detection (e.g., absorption) of light at the photodetector 120 increases the amount of current carried in the photodetector 120 above a current threshold (e.g., a current density threshold, a critical current threshold) of the photodetector 120 such that the photodetector 120 transitions to the non-superconducting state. In response to the photodetector 120 transitioning from the superconducting state to the non-superconducting state, the first portion (I1) of the bias current ($I_{bias}$) in the unit cell 110-1 is redirected from the one or more photodetectors 120 to the superconducting gate element 132 of the transistor 130. In some embodiments, at least a portion, less than all, of the first portion (I1) of the bias current ($I_{bias}$) is redirected from the one or more photodetectors 120 to the superconducting gate element 132 of the transistor 130. In some embodiments, substantially all (e.g., at least 80%, or 90%) of the first portion (I1) of the bias current ($I_{bias}$) is redirected from the one or more photodetectors 120 to the superconducting gate element 132 of the transistor 130. In response to the first portion (I1) of the bias current ($I_{bias}$) being redirected from the one or more photodetectors 120 to the superconducting gate element 132 of the transistor 130, the amount of current carried by the superconducting gate element 132 of the transistor 130 is increased above a current threshold (e.g., a current density threshold, a critical current threshold) of the superconducting gate element 132 of the transistor 130 such that the superconducting gate element 132 of the transistor 130 transitions from the superconducting state to the non-superconducting state. In response to the superconducting gate element 132 of the transistor 130 transitioning from the superconducting state to the non-superconducting state, a non-negligible amount of heat is transferred between the superconducting gate element 132 of the transistor 130 and the channel element 134 of the transistor 130. In response to an increase in temperature of the channel element 134 of the transistor 130 due to transfer of heat between the superconducting gate element 132 and the channel element 134 of the transistor, the resistance of the channel element 134 of the transistor changes from R1 to R1', as described above with respect to FIG. 3. The change in the resistance of the channel element 134 of the transistor from R1 to R1' affects the signal carried by the readout line 180. The change in the resistance of the channel element 134 of the transistor from R1 to R1' can be detected by a circuit 182 that is configured to receive signals (e.g., electrical signals) from the readout line 180.

While the first portion (I1) of the bias current ($I_{bias}$) is redirected from the one or more photodetectors 120 to the superconducting gate element 132 of the transistor 130 in the first unit cell 110-1, the bias current ($I_{bias}$) is transmitted through the one or more photodetectors 120 in the other unit cells 110 (e.g., subsequent and/or preceding unit cells) as described above with respect to FIGS. 7A and 7B. Thus, detection (e.g., absorption) of light (e.g., a photon) at a photodetector 120 of the first unit cell 110-1 does not affect operation of the other unit cells 110 in the photon counting device 100.

Figure 7D:
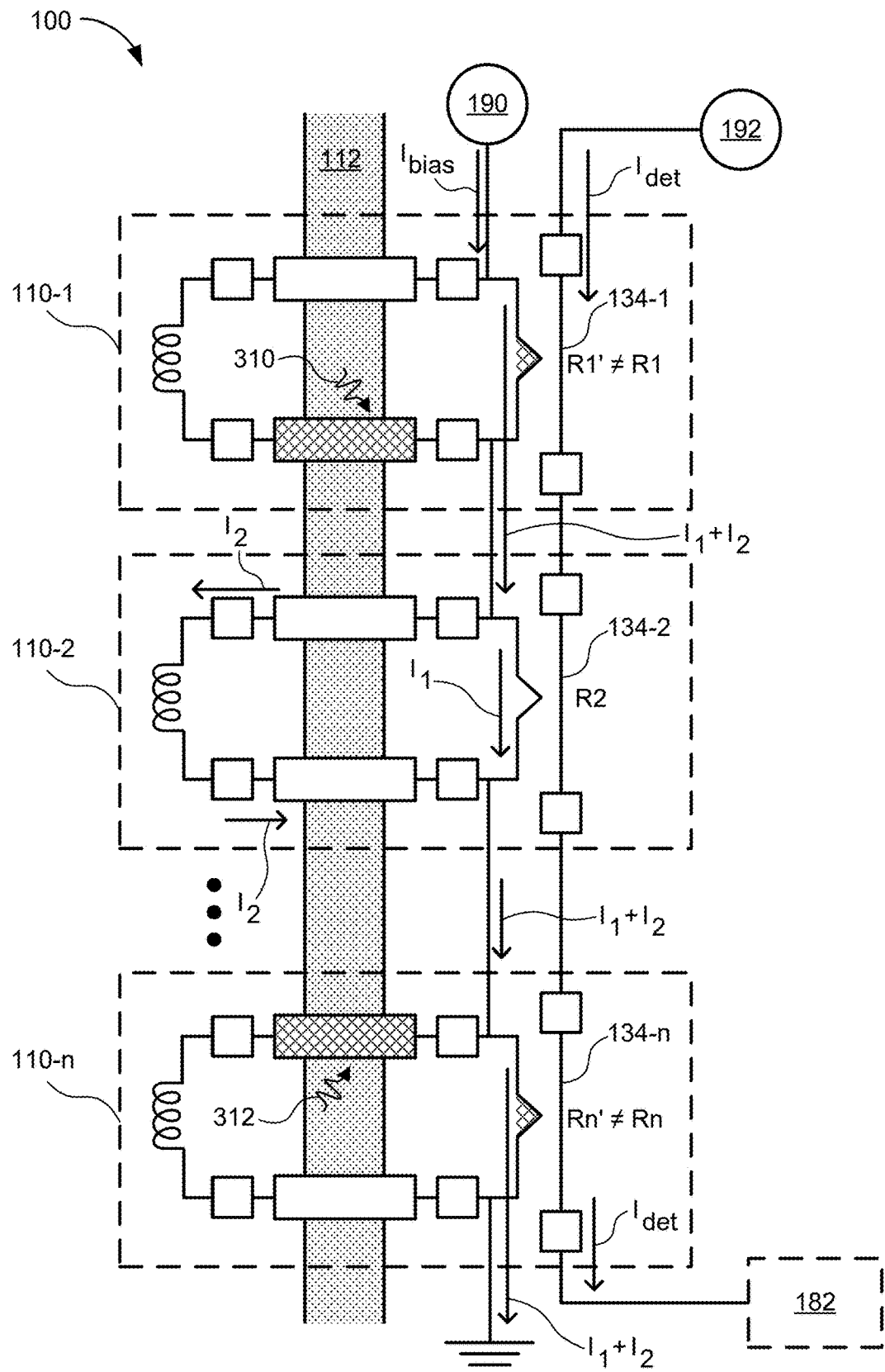

FIG. 7D illustrates the path of the bias current ($I_{bias}$) in the photon counting device 100 when (e.g., while) light is incident upon (e.g., detected or absorbed by) photodetectors 120 in a plurality of unit cells 110. In this example, a photodetector 120 of the first unit cell 110-1 detects (e.g., absorbs) a portion (e.g., at least a portion) of light (e.g., a first photon) propagating in the waveguide 112 and a photodetector 120 of another unit cell 110-n detects (e.g., absorbs) another portion of light (e.g., a second photon, distinct from the first photon) propagating in the waveguide 112. In response to detection (e.g., absorption) of the first photon at a photodetector 120 of the first unit cell 110-1, the first portion (I1) of the bias current ($I_{bias}$) is redirected from the one or more photodetectors 120 of the first unit cell 110-1 toward the superconducting gate element 132 of the transistor 130 of the first unit cell 110-1, leading to a change in the resistance of the channel element 134 of the transistor 130 of the first unit cell 110-1 from R1 to R1', as described above with respect to FIG. 7C. Similarly, in response to detection (e.g., absorption) of the second photon at a photodetector 120 of the unit cell 110-n, the first portion (I1) of the bias current ($I_{bias}$) is redirected from the one or more photodetectors 120 of the unit cell 110-n toward the superconducting gate element 132 of the transistor 130 of the unit cell 110-n, leading to a change in the resistance of the channel element 134 of the transistor 130 of the unit cell 110-n from Rn to Rn'. The unit cell 110-n responds to detection of the second photon at a photodetector 120 of the unit cell 110-n in a similar (e.g., same) way as the first unit cell 110-1 responds to detection of the first photon at a photodetector 120 of the first unit cell 110-1. Thus, the response of unit cell 110-n to detection (e.g., absorption) of the second photon at a photodetector 120 of the unit cell 110-n is the same as the response of the first unit cell 110-1 to detection (e.g., absorption) of the first photon at a photodetector 120 of the first unit cell 110-1, as provided with respect to FIG. 7C.

While the first portion (I1) of the bias current ($I_{bias}$) is redirected from the one or more photodetectors 120 to the superconducting gate element 132 of the transistor 130 in the first unit cell 110-1 and in the unit cell 110-n, the bias current ($I_{bias}$) is transmitted through the one or more photodetectors 120 in the other unit cells 110 (e.g., subsequent and/or preceding unit cells) as described above with respect to FIGS. 7A and 7B. Thus, detection (e.g., absorption) of light (e.g., a photon) at a photodetector 120 of any of the unit cells (e.g., first unit cell 110-1 and unit cell 110-n) does not affect operation of other unit cells 110 in the photon counting device 100.

Figure 8:
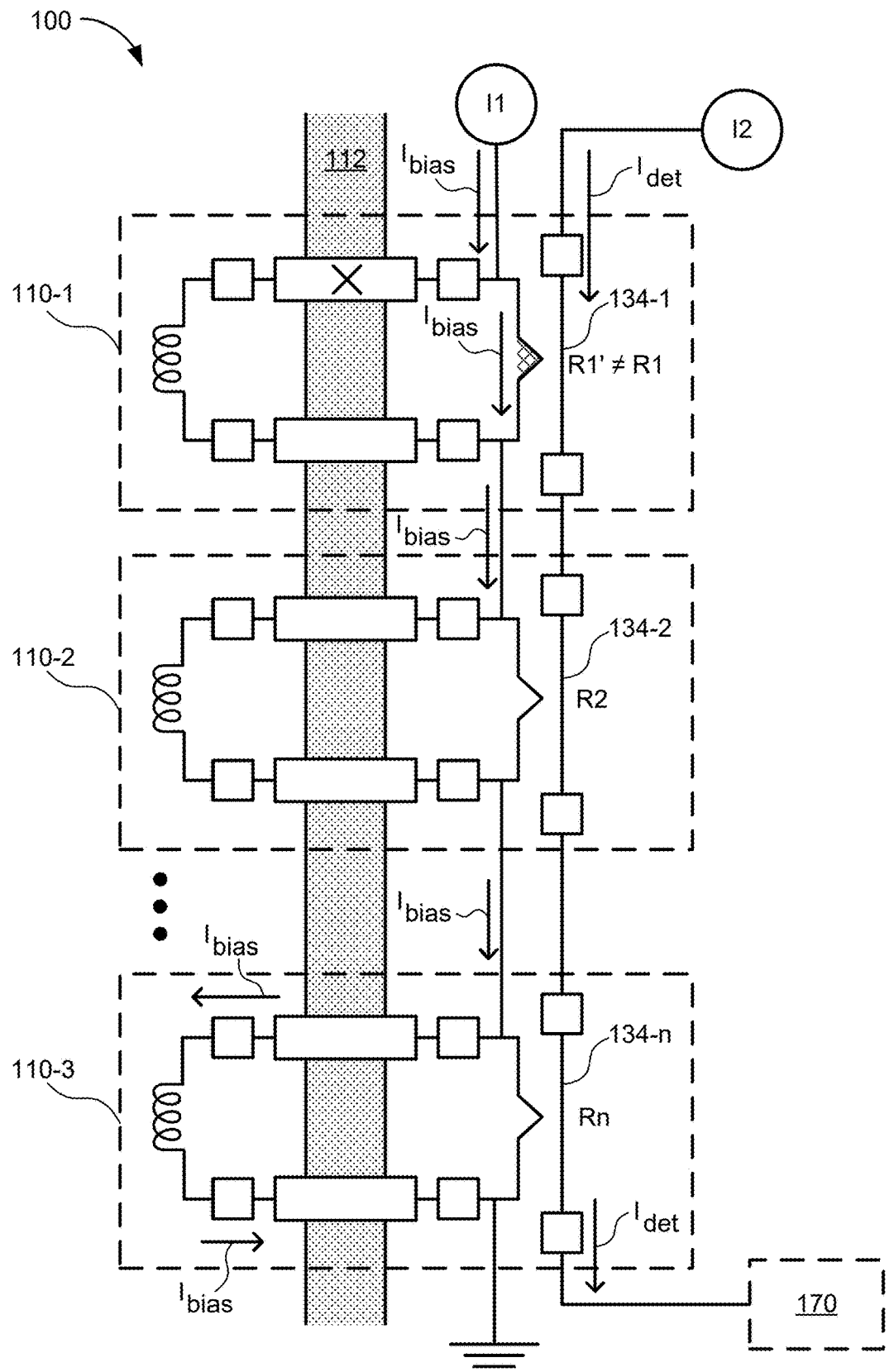
FIG. 8 is a circuit diagram illustrating operation of the photon counting device shown in FIGS. 1, 6A-6D, and 7A-7D while a unit cell is non-operational in accordance with some embodiments.

FIG. 8 is a circuit diagram illustrating operation of the photon counting device 100 shown in FIGS. 1, 6A-6D, and 7A-7D while a unit cell 110-n is non-operational in accordance with some embodiments. A unit cell 110-n may be non-operational for a number of reasons. For example, a superconducting component 210 of a photodetector 120 or an element (e.g., superconducting gate element 132 or channel element 134) of the transistor 130 of the unit cell 110-n may be non-functional or broken. This may occur due to manufacturing defect(s), or wear and tear over time. When a superconducting component 210 of a photodetector 120 of the unit cell 110-n is non-functional or broken, the superconducting component 210 is not in the superconducting state and does not exhibit superconducting properties. Thus, a broken or non-functional superconducting component 210 or photodetector 120 would have a non-zero or non-negligible resistance.

In the example shown in FIG. 8, the first unit cell 110-1 has a broken photodetector 120, signified by the "X". In response to the broken photodetector 120, at least a portion of the bias current ($I_{bias}$), such as the first portion (I1) of the bias current ($I_{bias}$), is redirected from the one or more photodetectors 120 to the superconducting gate element 132 of the transistor 130 of the first unit cell 110-1. In response to at least a portion of the bias current ($I_{bias}$) being redirected to the superconducting gate element 132 of the transistor 130, the superconducting gate element 132 transitions from the superconducting state to the non-superconducting state, thereby causing a change in the resistance, from R to R', of the channel element 134 of the transistor 130. While the response of the unit cell 110-n to a broken photodetector 120 is similar to the response of the unit cell 110-n to detection of a photon at the photodetector 120, they differ in the how long the response lasts. The response of the unit cell 110-n to detection of the a photon at a photodetector 120 is a dynamic response (e.g., time gated response, transient response) that extends for a time that corresponds to the relaxation time of the unit cell 110-n. The relaxation time of the unit cell 110-n is determined by (e.g., corresponds to) the current dynamics control element 140, as described above with respect to FIGS. 1 and 4A-4D. In some embodiments, the relaxation time of unit cells in the photon counting device 100 is on the order of picoseconds (e.g., 0.2 picoseconds to 2.0 picoseconds) such that each unit cell 110-n or each photodetector 120 of the unit cell 110-n operates in the GHz range. In contrast, the response of the unit cell 110-n to a broken photodetector 120 is a constant response (e.g., not varying in time) since the superconducting component 210 of the photodetector 120 is always in a non-superconducting state. Thus, the resistance of the channel element 134 of the transistor 130 of the unit cell 110-n with the broken photodetector does not change in time during operation of the photon counting device 100. Thus, the signal produced by the channel element 134 of the transistor 130 of the unit cell 110-n with the broken photodetector is part of the baseline signal transmitted through the readout line 180 since there is no change in the resistance of the channel element 134 of the transistor 130 (e.g., the resistance of the channel element 134 of the transistor 130 is always R' since the channel element 134 of the transistor 130 is always in the second state when the unit cell 110-n is non-functional).

In some embodiments, operation of the photon counting device 100 is time-gated in order to reduce dark noise. For example, when light is not expected to be incident upon a photodetector 120 of the photon counting device (e.g., photon source 504 is off or waveguide 112 is not connected to a photon source 504), current source 192 may be turned off (e.g., so that a detection current ($I_{det}$) is not provided). In some embodiments, recorded data that is not within a time-gated time frame is ignored (e.g., not used, thrown out).

Figure 9A:
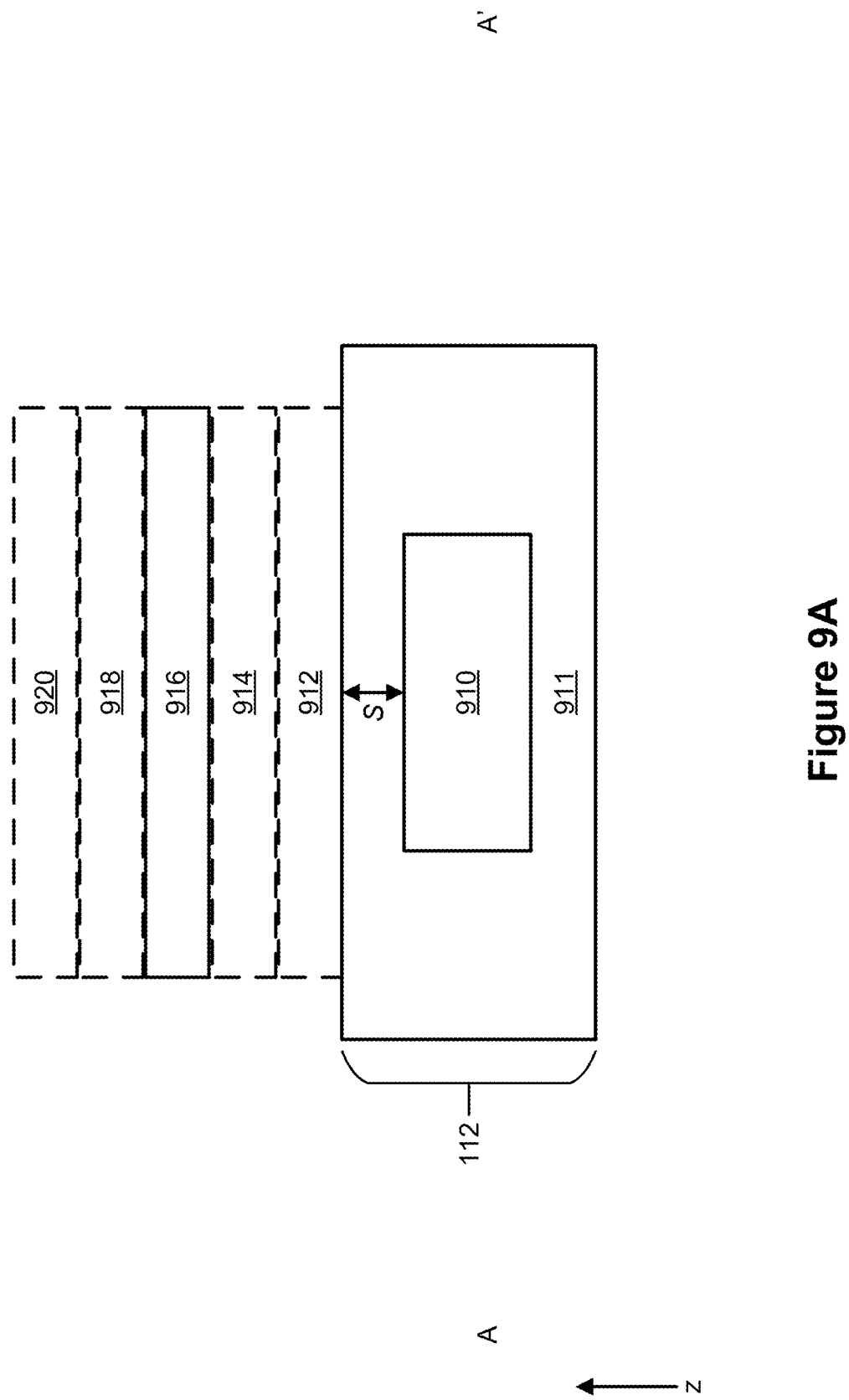
FIGS. 9A-9C illustrate cross-sectional views of a unit cell of the photon counting device shown in FIG. 6A in accordance with some embodiments.
Figure 9B:
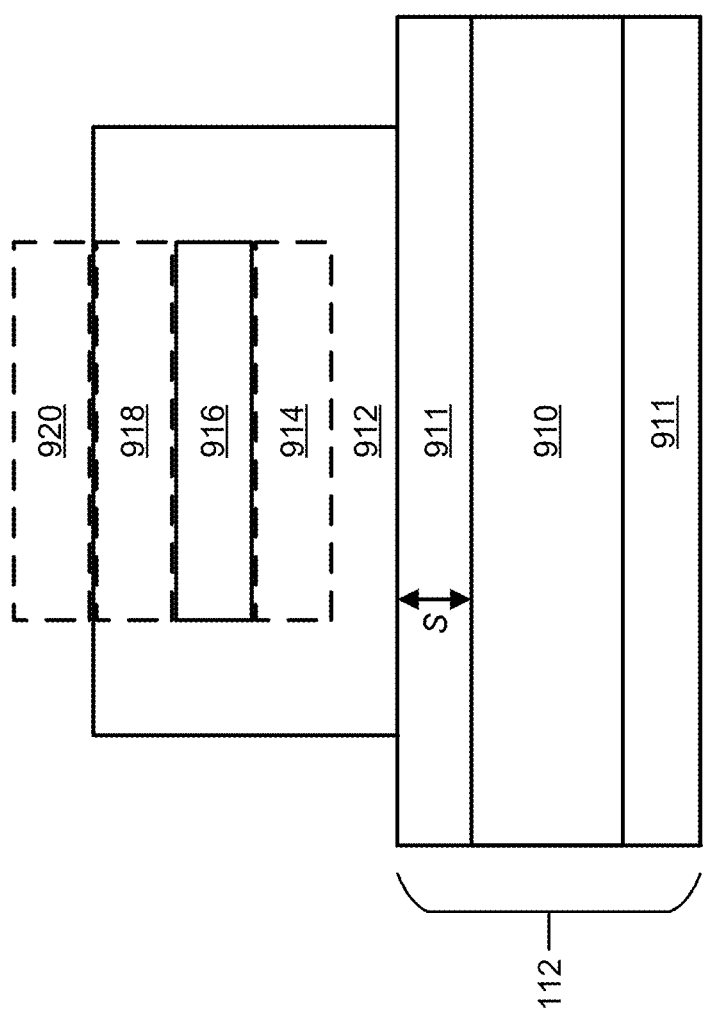
Figure 9C:
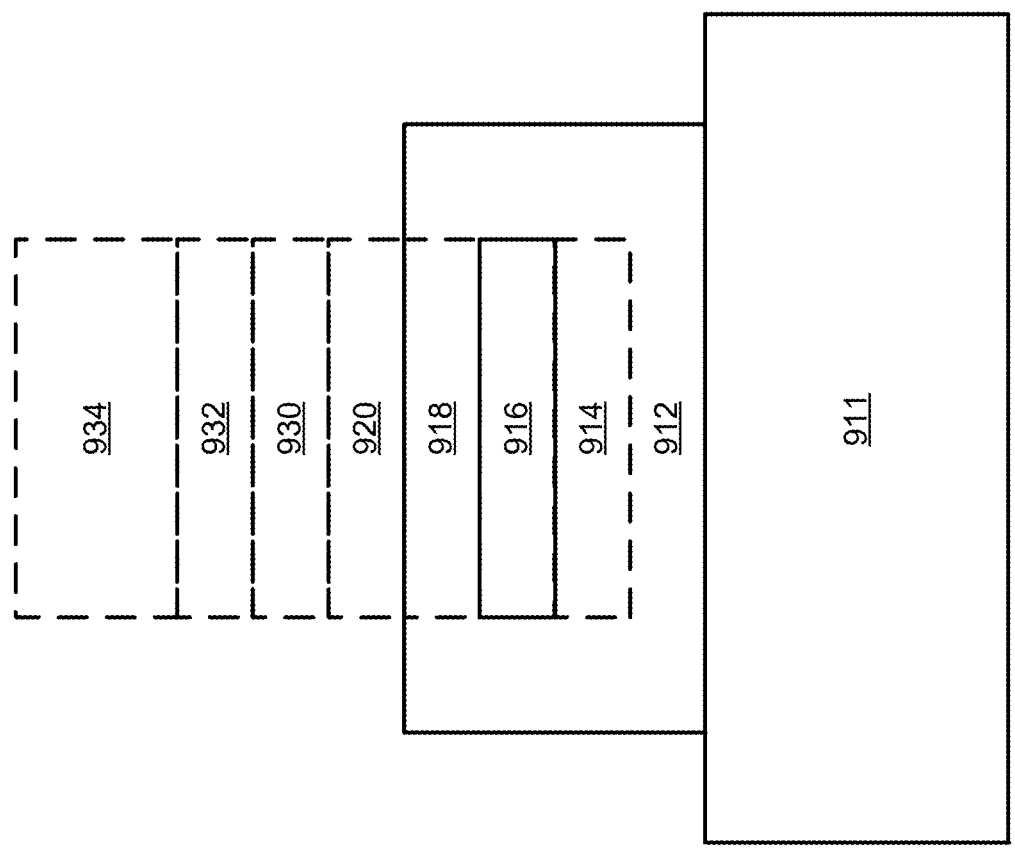
Figure 10A:
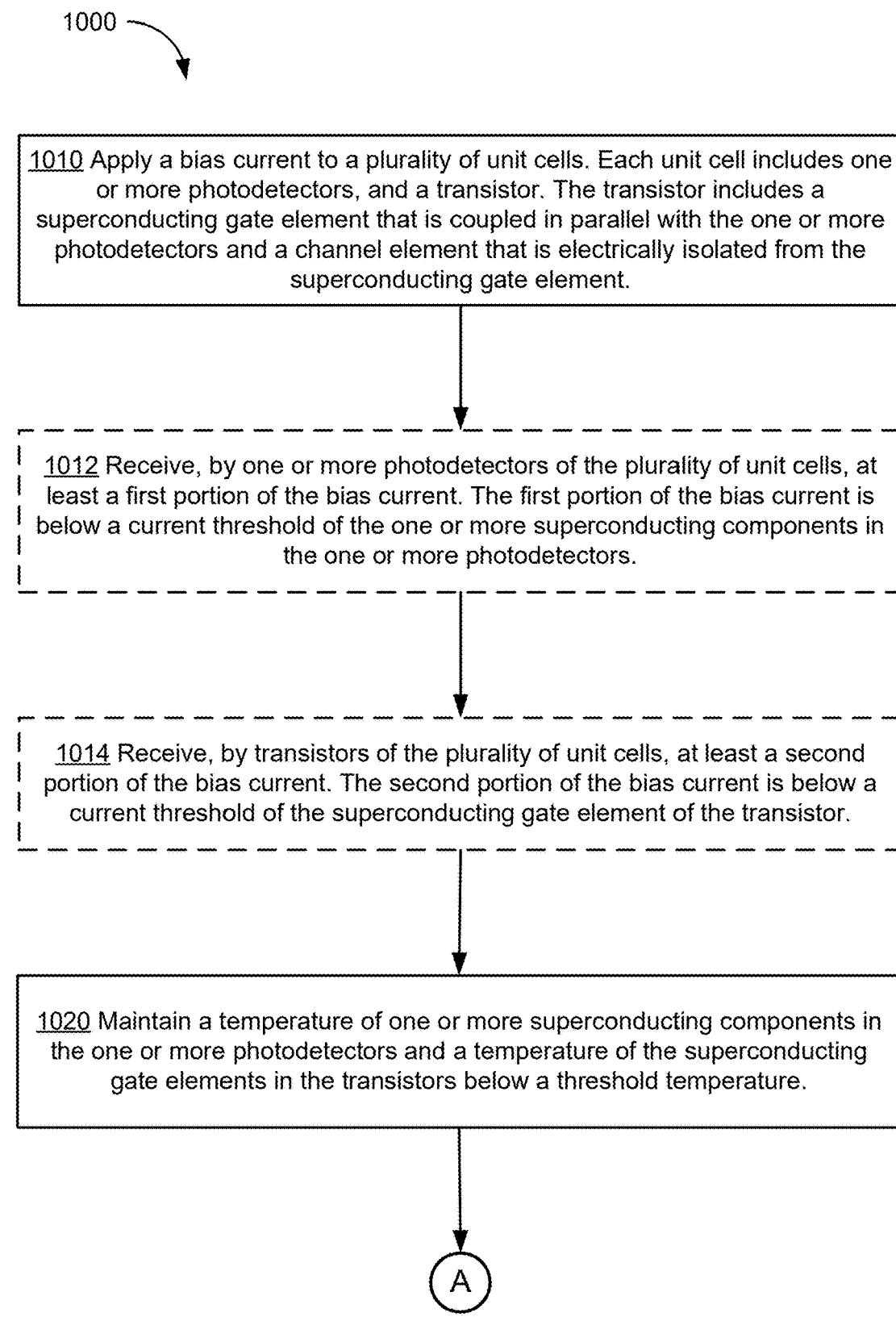
Figure 10B:
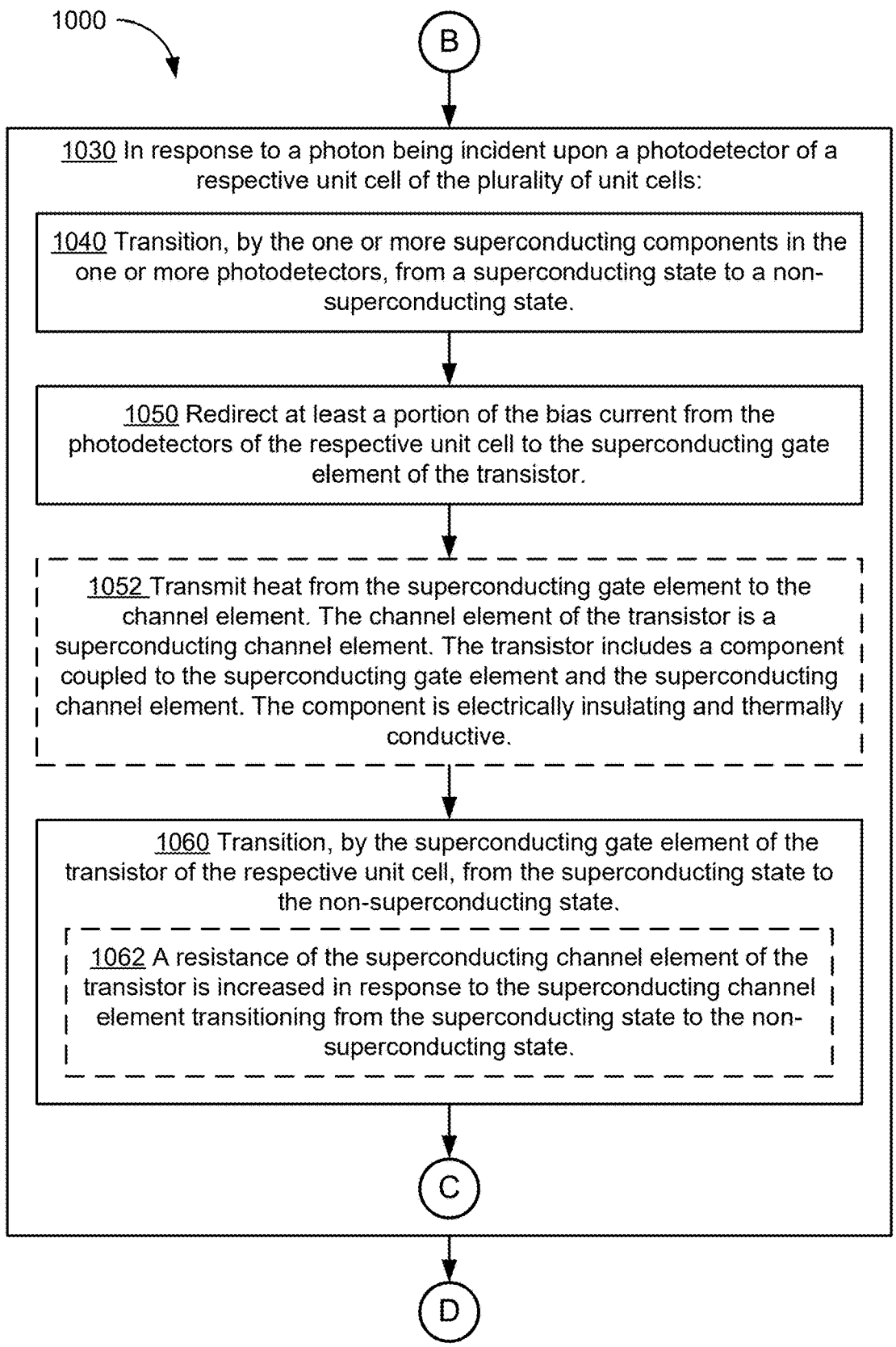
Figure 10D:
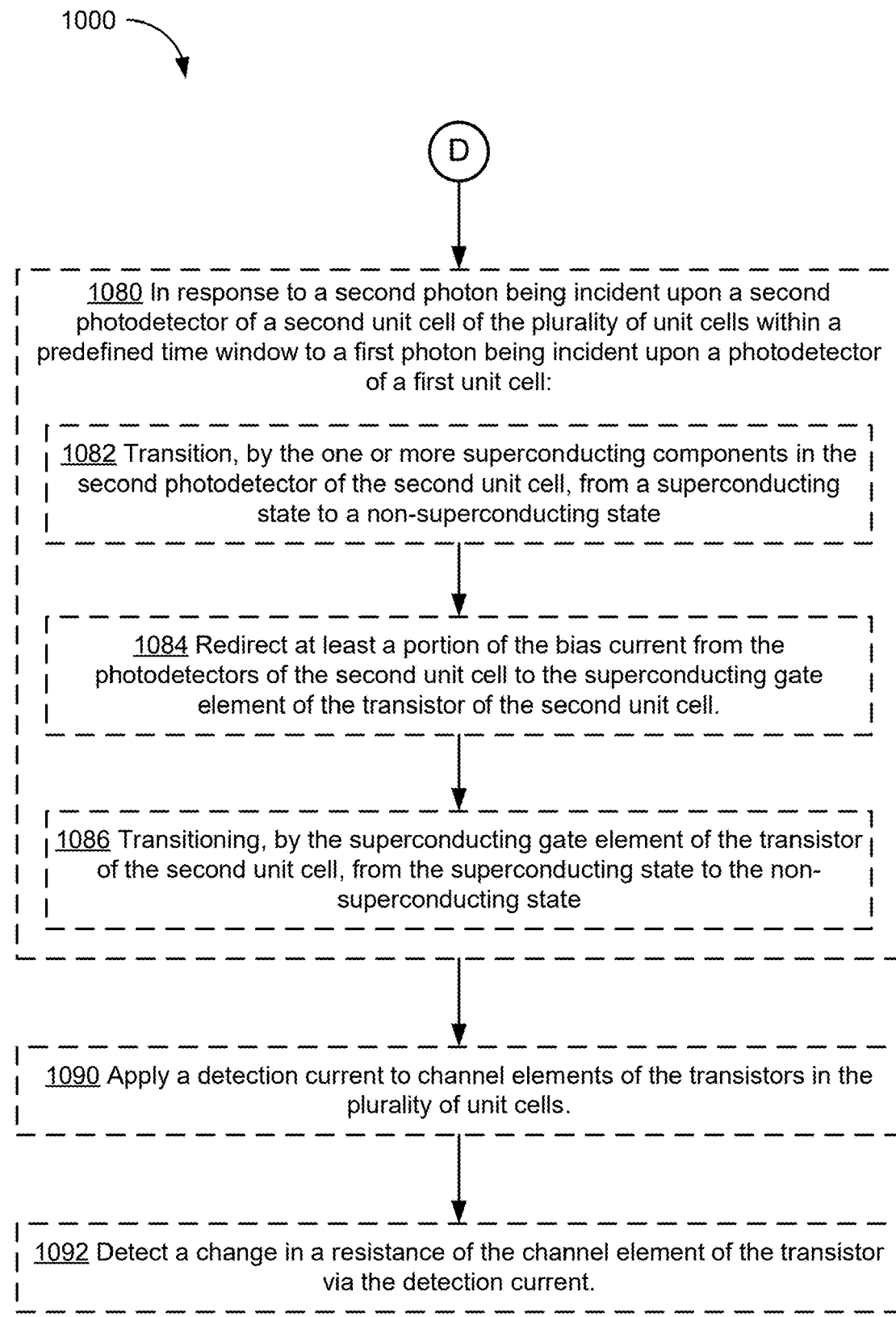

FIGS. 9A-9C illustrate cross-sectional views of a unit cell of the photon counting device shown in FIG. 6A in accordance with some embodiments.

FIG. 9A illustrates a cross-sectional view across AA' of the unit cell 110 shown in FIG. 6A, which illustrates that the waveguide 112 and the superconducting components 210 of a photodetector 120 are formed in layers. The cross-section shows that the photon counting device 100 includes a plurality of layers, including a layer that corresponds to the waveguide 112. In some embodiments, the waveguide 112 includes a waveguide core 910 as well as a surrounding cladding 911. In some embodiments, the core 910 is composed of silicon (e.g., Si) or silicon nitride ($SiN_x$). In some embodiments, the cladding 911 is composed of silicon oxide ($SiO_2$) or silicon nitride ($SiN_x$). In some embodiments, the cladding 911 has thickness such that the core 910 of the waveguide 112 is separated from another layer 912 of the photon counting device 100 by a predetermined distance S. In some embodiments, the cladding 911 has thickness between 0 to 100 nm (e.g., Sis between 0 to 100 nm).

The plurality of layers also includes a superconducting layer 916 (e.g., a layer formed of superconducting material, such as nobium nitride (NbN)), distinct from the waveguide layer (e.g., waveguide 112) that corresponds to the superconducting components 210 of the photodetectors 120. The superconducting layer 916 forms the superconducting component 210 of the photodetectors 120 and in some cases, also forms the superconducting gate element 132 of the transistor 130. In some embodiments, layer 916 is between 2 nm to 20 nm thick. While FIG. 9A illustrates the waveguide 112 being formed under the superconducting layer 916, in some embodiments, the waveguide 112 may be formed on top of the superconducting layer 916.

In some embodiments, the plurality of layers includes additional layers such as layers 912, 914, 918, and 920. Layers 914, 918, and 920 are optional. For example, layer 912 includes (e.g., is composed of) silicon nitride ($SiN_x$) and has a thickness between 0-100 nm, layer 914 includes (e.g., is composed of) aluminum nitride (AlN) and has a thickness between 0-100 nm, layer 918 includes (e.g., is composed of) aluminum nitride (AlN) and has a thickness between 0-10 nm, and layer 920 includes (e.g., is composed of) amorphous silicon (a-Si) and has a thickness between 0-20 nm.

FIG. 9B illustrates a cross-sectional view across BB' of the unit cell 110 shown in FIG. 6A. In some embodiments, layer 912 at least partially surrounds layers 914, 916, and 918, and is configured to function as a cladding around the superconducting components 210 of the photodetector 120 formed in layer 916.

FIG. 9C illustrates a cross-sectional view across CC' of the unit cell 110 shown in FIG. 6A which illustrates how the transistor 130 is formed in layers. Layer 916 shown in FIG. 9C corresponds to (e.g., is the same as, is connected to, is the same layer as) layer 916 as shown in FIGS. 9A and a 9B. Cladding 911 also corresponds to cladding 911 shown in FIGS. 9A and a 9B.

In some embodiments, such as when the transistor 130 includes a superconducting gate element 132, the superconducting gate element 132 of the transistor 130 may be formed on layer 916. Alternatively, the superconducting gate element 132 of the transistor 130 may be formed in any of the layers 930, 932, and 934. Layers 930, 932, and 934 are optional. In some embodiments, layers 930, 932, and 934 are metal layers that may include (e.g., be composed of) a semiconductor material or a superconductor material. In some embodiments, layer 930 has a thickness between 0-100 nm. In some embodiments, layer 932 has a thickness between 0-100 nm. In some embodiments, layer 934 has a thickness between 0-1 μm.

In some embodiments, the channel elements 134 of the transistors 130 that form the readout line 180 in the photon counting device 100 are formed in a layer that is disposed above or below a layer corresponding to the superconducting gate elements 132 of the transistors 130. For example, the superconducting gate elements 132 of the transistors 130 may be formed in layer 916 and the channel elements 134 of the transistors 130 may be formed in any of layers 930, 932, and 934.

FIGS. 10A-10D illustrate a flow diagram of a method 1000 of operating the photon counting device, for example, the photon counting device 100 shown in FIGS. 1, 6A-6D, 7A-7D, and 8 in accordance with some embodiments. In some embodiments, the method 1000 is performed while the photon counting device, or at least portions of the photon counting device, such as superconducting components 210 of photodetectors 120 and superconducting gate elements 132 of transistors 130 are maintained at temperature(s) that are below threshold temperature(s) of the superconducting components 210 of the photodetectors 120 and the superconducting gate elements 132 of the transistors 130 of the photon counting device 100.

The method 1000 includes applying (1010) a bias current ($I_{bias}$) to a plurality of unit cells 110. Each unit cell 110 includes one or more photodetectors 120, and a transistor 130. The transistor 130 includes a superconducting gate element 132 that is coupled in parallel with the one or more photodetectors 120, and a channel element 134 that is electrically isolated from the superconducting gate element 132. The method 1000 also includes maintaining (1020) a temperature of one or more superconducting components (e.g., nanowires 210) in the one or more photodetectors 120 and a temperature of the superconducting gate elements 132 of the transistors 130 in the photon counting device below threshold temperatures (e.g., critical temperatures of the photodetectors 120 and the superconducting gate elements 132 of the transistors 130).

In response (1030) to a photon being incident upon a photodetector 120 of a respective unit cell of the plurality of unit cells 110: (i) the one or more superconducting components (e.g., nanowires 210) in the one or more photodetectors 120 transition (1040) from a superconducting state to a non-superconducting state; (ii) at least a portion of the bias current ($I_{bias}$) is redirected (1050) from the photodetectors 120 of the respective unit cell (e.g., unit cell 110-n) to the superconducting gate element 132 of the transistor 130; and (iii) the superconducting gate element 132 of the transistor 130 of the respective unit cell transitions (1060) from the superconducting state to the non-superconducting state.

In some embodiments, the method 1000 also includes receiving (1012), by one or more photodetectors 120 of the plurality of unit cells 110, at least a first portion of the bias current (e.g., portion I1 of the bias current ($I_{bias}$), the bias current ($I_{bias}$)). The first portion of the bias current ($I_{bias}$) is below a current threshold of the one or more superconducting components (e.g., nanowires 210) in the one or more photodetectors 120.

In some embodiments, the method 1000 also includes receiving (1014), by transistors 130 of the plurality of unit cells 110, at least a second portion of the bias current (e.g., portion I2 of the bias current ($I_{bias}$), the bias current ($I_{bias}$)). The second portion of the bias current ($I_{bias}$) is below a current threshold of the superconducting gate element 132 of the transistor 130.

In some embodiments, in response (1030) to a photon being incident upon a photodetector 120 of a respective unit cell of a plurality of unit cells 110, heat is transmitted (1052) from the superconducting gate element 132 to the channel element 134 of a same transistor 130, the channel element 134 of the transistor 130 is a superconducting channel element, and the transistor 130 includes a component coupled to the superconducting gate element 132 and the superconducting channel element 134. The component is electrically insulating and thermally conductive (e.g., allows heat to be transferred between the superconducting gate element 132 and the superconducting channel element 134 and does not facilitate transfer of electrons or electrical current between the superconducting gate element 132 and the superconducting channel element 134). In some embodiments, a resistance of the superconducting channel element 134 of the transistor 130 is increased (e.g., from R to R' where R'>R) (1062) in response to the superconducting channel element 134 transitioning from the superconducting state to the non-superconducting state.

In some embodiments, in response (1030) to a photon being incident upon a photodetector 120 of a respective unit cell of a plurality of unit cells 110, heat is transmitted (1070) from the superconducting gate element 132 to the channel element 134 of a same transistor 130, the channel element 134 of the transistor is a semiconductor channel element 134, and the transistor 130 includes a component coupled to each of the superconducting gate element 132 and the semiconductor channel element 134. The component is electrically insulating and thermally conductive. A resistance of the semiconductor channel element 134 of the transistor 130 is decreased (from R to R' where R'<R) in response to an increase in temperature of the semiconductor channel element 134.

In some embodiments, in response (1080) to a second photon being incident upon a second photodetector 120 of a second unit cell (e.g., unit cell 110-n) of the plurality of unit cells 110 within a predefined time window (e.g., substantially concurrently, less than the relaxation time) of a first photon being incident upon a photodetector 120 of a first unit cell (e.g., unit cell 110-1): (i) the one or more superconducting components (e.g., nanowire 210) in the second photodetector 120 of the second unit cell, transition (1082) from a superconducting state to a non-superconducting state; (ii) at least a portion of the bias current ($I_{bias}$) is redirected (1084) from the photodetectors of the second unit cell (e.g., unit cell 110-n) to the superconducting gate element 132 of the transistor 130 of the second unit cell (e.g., unit cell 110-n); and (iii) the superconducting gate element 132 of the transistor 130 of the second unit cell (e.g., unit cell 110-n) transitions (1086) from the superconducting state to the non-superconducting state.

In some embodiments, the method 1000 further includes applying (1090) a detection current ($I_{det}$) to channel elements 134 of the transistors 130 in the plurality of unit cells 110, and detecting (1092) a change in a resistance (e.g., from R to R') of the channel element 134 of the transistor 130 via the detection current ($I_{det}$).

Although some of various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives.

As used herein, a "superconducting component" or "superconductor component" is a component having one or more superconducting materials. For example, a superconducting photodetector circuit is a photodetector circuit that includes one or more superconducting materials. As used herein, a "superconducting" material is a material that is capable of operating in a superconducting state (under particular conditions). For example, a material that operates as a superconductor (e.g., operates with zero electrical resistance) when cooled below a particular temperature (e.g., a critical temperature) and having less than a threshold current flowing through it. A superconducting material is also called a superconduction-capable material. In some embodiments, the superconducting materials operate in a non-superconducting state during which the materials have a non-zero electrical resistance (e.g., a resistance in the range of one thousand to ten thousand ohms). For example, a superconducting material supplied with a current greater than a threshold superconducting current for the superconducting material may transition from a superconducting state with zero electrical resistance to a non-superconducting state with non-zero electrical resistance. As an example, superconducting component 210 of photodetector 120 is a superconducting material that is capable of operating in a superconducting state (e.g., under particular operating conditions).

As used herein, a "wire" is a section of material configured for transferring electrical current. In some embodiments, a wire includes a section of material conditionally capable of transferring electrical current (e.g., a wire made of a superconducting material that is capable of transferring electrical current while the wire is maintained at a temperature below a critical temperature). A cross-section of a wire (e.g., a cross-section that is perpendicular to a length of the wire) optionally has a geometric (e.g., flat or round) shape or an irregular (also sometimes called a non-geometric) shape. In some embodiments, a length of a wire is greater than a width or a thickness of the wire (e.g., the length of a wire is at least 5, 6, 7, 8, 9, or 10 times greater than the width and the thickness of the wire).

It will also be understood that, although the terms first, second, etc. are, in some instances, used herein to describe various elements, these elements should not be limited by these terms. These terms are only used to distinguish one element from another. For example, a first layer could be termed a second layer, and, similarly, a second layer could be termed a first layer, without departing from the scope of the various described embodiments. The first layer and the second layer are both layers, but they are not the same layer unless explicitly stated as such.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A photon counting device, comprising:
   a unit cell comprising:
      one or more photodetectors, each photodetector including one or more superconducting components;
      a current dynamics control element coupled in series with the one or more photodetectors, the current dynamics control element being adapted for a predefined relaxation time of the unit cell; and
      a transistor having a superconducting gate element that is coupled with the one or more photodetectors and a channel element that is electrically insulated from the superconducting gate element via a thermally-conductive component composed of a non-superconducting material, wherein the channel element has a first resistance while the superconducting gate element is in a superconducting state and a second resistance while the superconducting gate element is in a non-superconducting state;
   a bias current source coupled to the unit cell; and
   a waveguide optically coupled to the unit cell, wherein:
      each photodetector of the one or more photodetectors is optically coupled to the waveguide;
      a superconducting component of the one or more superconducting components is configured to transition from the superconducting state to the non-superconducting state in response to a photon being incident upon the superconducting component while the superconducting component receives at least a portion of bias current output from the bias current source;

the superconducting gate element of the transistor is configured to transition from the superconducting state to the non-superconducting state in response to the superconducting component transitioning to the non-superconducting state; and wherein while the superconducting gate element is in the non-superconducting state, heat generated by the superconducting gate element is transferred to the channel element causing the channel element to have the second resistance.

2. The photon counting device of claim 1, further comprising:
a second circuit coupled to the channel element of the transistor and configured to receive an electrical signal transmitted through the channel element of the transistor.

3. The photon counting device of claim 1, wherein each photodetector of the one or more photodetectors is a superconducting nanowire avalanche photo detector that includes two or more superconducting components coupled in parallel with one another.

4. The photon counting device of claim 1, wherein the unit cell further comprises a thermal buffer element disposed between the superconducting gate element of the transistor and a photodetector of the one or more photodetectors.

5. The photon counting device of claim 1, wherein:
the channel element is a superconducting channel element; and
the second resistance is greater than the first resistance.

6. The photon counting device of claim 1, wherein:
the channel element is a semiconducting channel element; and
the first resistance is greater than the second resistance.

7. The photon counting device of claim 1, wherein the waveguide is tapered.

8. The photon counting device of claim 1, wherein the waveguide includes a first end coupled to a photon source and another end coupled to a mirror.

9. A method for operating a photon counting device, comprising:
applying a bias current to a unit cell, the unit cell comprising:
one or more photodetectors;
a current dynamics control element coupled in series with the one or more photodetectors, the current dynamics control element being adapted for a predefined relaxation time of the unit cell; and
a transistor having a superconducting gate element that is coupled in parallel with the one or more photodetectors and a channel element that is electrically insulated from the superconducting gate element via a thermally-conductive component composed of a non-superconducting material;
maintaining a temperature of one or more superconducting components in the one or more photodetectors and a temperature of the superconducting gate element in the transistor below a threshold temperature; and
in response to a photon being incident upon a photodetector of the one or more photodetectors:
transitioning, by the one or more superconducting components in the photodetector upon which the photon is incident, from a superconducting state to a non-superconducting state;
redirecting at least a portion of the bias current from the one or more photodetectors to the superconducting gate element of the transistor; and transitioning, by the superconducting gate element of the transistor, from the superconducting state to the non-superconducting state, wherein while the superconducting gate element is in the non-superconducting state, heat generated by the superconducting gate element is transferred to the channel element causing the channel element to have an increased resistance.

10. The method of claim 9, further comprising:
applying a detection current to the channel element of the transistor; and
detecting a change in a resistance of the channel element of the transistor via the detection current.

11. The method of claim 9, wherein the channel element of the transistor is a superconducting channel element, and the transistor further includes a component coupled to the superconducting gate element and the superconducting channel element, the component being electrically insulating and thermally conductive; and
the method further comprises, in response to the photon being incident upon one of the one or more photodetectors of the unit cell:
transmitting heat from the superconducting gate element to the superconducting channel element; and
transitioning, by the superconducting channel element, from the superconducting state to the non-superconducting state, wherein a resistance of the superconducting channel element of the transistor is increased in response to the superconducting channel element transitioning from the superconducting state to the non-superconducting state.

12. The method of claim 9, wherein the channel element of the transistor is a semiconductor channel element, and the transistor further includes a component coupled to each of the superconducting gate element and the semiconductor channel element, the component being electrically insulating and thermally conductive; and
the method further comprises, in response to the photon being incident upon a photodetector of the one or more photodetectors, transmitting heat from the superconducting gate element to the semiconductor channel element, wherein a resistance of the semiconductor channel element of the transistor is decreased in response to an increase in temperature of the semiconductor channel element.

13. The method of claim 9, further comprising:
receiving, by the one or more photodetectors, at least a first portion of the bias current, wherein the first portion of the bias current is below a current threshold of the one or more superconducting components in the one or more photodetectors.

14. The method of claim 9, wherein the photon is a first photon, and the unit cell is a first unit cell; and
the method further comprises, in response to a second photon being incident upon a second photodetector of a second unit cell within a predefined time window of the first photon being incident upon one of the one or more photodetectors of the first unit cell:
transitioning, by one or more superconducting components in the second photodetector of the second unit cell, from the superconducting state to the non-superconducting state;
redirecting at least a portion of the bias current from the second photodetector to a superconducting gate element of a transistor of the second unit cell; and
transitioning, by the superconducting gate element of the transistor of the second unit cell, from the superconducting state to the non-superconducting state.

15. A photon-number resolving detector, comprising:
a plurality of photon detecting units coupled in series, each respective photon detecting unit of the plurality of photon detecting units comprising:
  one or more superconducting photodetectors;
  a current dynamics control element coupled in series with the one or more superconducting photodetectors; and
  a gate of an impedance amplifier coupled in parallel with the one or more superconducting photodetectors of the respective photon detecting unit;
a readout line coupled to output channels of the impedance amplifiers of the plurality of photon detecting units, wherein each respective output channel is coupled to a corresponding gate via a thermally-conductive component composed of a non-superconducting material, and wherein heat generated by the corresponding gate is transferred to the respective output channel causing the respective output channel to have an increased resistance; and
a second circuit coupled to the readout line.

16. The photon-number resolving detector of claim 15, wherein a respective output channel of each photon detecting unit's impedance amplifier is electrically-isolated from the gate of the impedance amplifier.

17. The photon-number resolving detector of claim 15, further comprising a waveguide optically coupled to the plurality of photon detecting units.

18. The photon-number resolving detector of claim 15, wherein each respective photon detecting unit of the plurality of photon detecting units further comprises:
  a thermal buffer element disposed between the gate of an impedance amplifier and a superconducting photodetector of the one or more superconducting photodetectors.

19. The photon-number resolving detector of claim 15, wherein the second circuit is configured to generate a signal corresponding to a count of photons received by the plurality of photon detecting units.

20. The photon-number resolving detector of claim 15, further comprising a current source configured to apply a direct current bias to the plurality of photon detecting units.

\* \* \* \* \*